United States Patent
Kida et al.

(10) Patent No.: US 10,666,220 B2
(45) Date of Patent: May 26, 2020

(54) ACOUSTIC WAVE DEVICE

(71) Applicant: TAIYO YUDEN CO., LTD., Tokyo (JP)

(72) Inventors: Masumi Kida, Tokyo (JP); Tokihiro Nishihara, Tokyo (JP); Yoshio Satoh, Tokyo (JP); Shinji Taniguchi, Tokyo (JP); Taisei Irieda, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 0 days.

(21) Appl. No.: 15/623,307

(22) Filed: Jun. 14, 2017

(65) Prior Publication Data

US 2018/0006631 A1 Jan. 4, 2018

(30) Foreign Application Priority Data

Jun. 29, 2016 (JP) .................................. 2016-129230

(51) Int. Cl.
*H03H 9/02* (2006.01)
*H03H 9/205* (2006.01)
(Continued)

(52) U.S. Cl.
CPC ........ *H03H 9/02133* (2013.01); *H03H 9/173* (2013.01); *H03H 9/205* (2013.01); *H03H 9/568* (2013.01)

(58) Field of Classification Search
CPC .............................. H03H 9/54; H01L 41/0472
See application file for complete search history.

(56) References Cited

U.S. PATENT DOCUMENTS 6,262,637 B1 7/2001 Bradley et al.
2006/0186762 A1 8/2006 Sugiura et al.
(Continued)

FOREIGN PATENT DOCUMENTS

JP 2001-24476 A 1/2001
JP 2006-229901 A 8/2006
(Continued)

OTHER PUBLICATIONS

Japanese Office Action dated Dec. 18, 2018, in a counterpart Japanese patent application No. 2016-129230. (A machine translation (not reviewed for accuracy) attached.).

*Primary Examiner* — Samuel S Outten
(74) *Attorney, Agent, or Firm* — Chen Yoshimura LLP

(57) ABSTRACT

An acoustic wave device includes: a substrate; an acoustic reflection layer located in or on the substrate and including an air gap, or an acoustic mirror; a piezoelectric film located on the acoustic reflection layer; lower and upper electrodes located on the acoustic reflection layer so as to sandwich the piezoelectric film so that resonance regions are located within the acoustic reflection layer and share the acoustic reflection layer, one of the lower and upper electrodes being divided, another one of the lower and upper electrodes being not divided, the lower and upper electrodes facing each other across the piezoelectric film in each of the resonance regions; and an insertion film located between the lower and upper electrodes, located in at least a part of an outer peripheral region of each of the resonance regions, and being not located in a center region of each of the resonance regions.

16 Claims, 25 Drawing Sheets

(51) Int. Cl.
*H03H 9/56* (2006.01)
*H03H 9/17* (2006.01)

(56) References Cited

U.S. PATENT DOCUMENTS

| | | |
|---|---|---|
| 2008/0055021 A1 | 3/2008 | Ueda et al. |
| 2008/0252398 A1 | 10/2008 | Jamneala et al. |
| 2010/0033063 A1 | 2/2010 | Nishihara et al. |
| 2013/0038405 A1 | 2/2013 | Taniguchi et al. |
| 2014/0210570 A1* | 7/2014 | Nishihara ................ H03H 9/70 333/133 |
| 2015/0171826 A1 | 6/2015 | Sakashita et al. |

FOREIGN PATENT DOCUMENTS

| | | |
|---|---|---|
| JP | 2008-85989 A | 4/2008 |
| JP | 2008-211394 A | 11/2008 |
| JP | 2009-10932 A | 1/2009 |
| JP | 2010-45437 A | 2/2010 |
| JP | 2013-38658 A | 2/2013 |
| JP | 2014-161001 A | 9/2014 |
| JP | 2015-119249 A | 6/2015 |

* cited by examiner

ACOUSTIC WAVE DEVICE

CROSS-REFERENCE TO RELATED APPLICATION

This application is based upon and claims the benefit of priority of the prior Japanese Patent Application No. 2016-129230, filed on Jun. 29, 2016, the entire contents of which are incorporated herein by reference.

FIELD

A certain aspect of the present invention relates to an acoustic wave device.

BACKGROUND

Acoustic wave devices using piezoelectric thin film resonators have been used for filters and multiplexers of wireless devices such as, for example, mobile phones. The piezoelectric thin film resonator has a structure designed to have a lower electrode and an upper electrode facing each other across a piezoelectric film as disclosed in Japanese Patent Application Publication No. 2001-24476 (hereinafter, referred to as Patent Document 1). The region where the lower electrode and the upper electrode face each other across the piezoelectric film is a resonance region. An air gap or an acoustic mirror is located under the resonance region so as to prevent the restriction of the oscillation. The air gap or the acoustic mirror is formed so as to include the resonance region in plan view.

It has been known to arrange a plurality of piezoelectric thin film resonators so as to be included in a single air gap in plan view as disclosed in, for example, Patent Document 1. It has been known that adjacent piezoelectric thin film resonators that do not share the air gap share the lower electrode as disclosed in, for example, Japanese Patent Application Publication No. 2013-38658 (hereinafter, referred to as Patent Document 2). It has been known to form an insertion film in an outer peripheral region in the piezoelectric film as disclosed in, for example, Japanese Patent Application Publication No. 2014-161001 (hereinafter, referred to as Patent Document 3). It has been known that a resonator is divided so as to have the polarization direction of the piezoelectric film in which the secondary distortion is reduced as disclosed in, for example, Japanese Patent Application Publication Nos. 2008-85989 and 2009-10932 (hereinafter, referred to as Patent Documents 4 and 5).

For example, when a resonator is divided so as to reduce the secondary distortion as described in Patent Documents 4 and 5, it may be considered to share the lower electrode of the adjacent piezoelectric thin film resonators as described in Patent Document 2. However, when the lower electrode or the like connecting the adjacent piezoelectric thin film resonators is long, the secondary distortion is not completely cancelled between the divided resonators. When a plurality of piezoelectric thin film resonators are located in a single air gap as described in Patent Document 1, the distance between the piezoelectric thin film resonators can be shortened. However, since a complicated structure is provided in a single air gap, the multilayered film or the like may be damaged. For example, cracks may be formed.

SUMMARY OF THE INVENTION

According to a first aspect of the present invention, there is provided an acoustic wave device including: a substrate; an acoustic reflection layer located in or on the substrate, the acoustic reflection layer including an air gap, or an acoustic mirror in which at least two layers with different acoustic characteristics are stacked; a piezoelectric film located on the substrate and the acoustic reflection layer; a lower electrode and an upper electrode located on the substrate and the acoustic reflection layer so as to sandwich the piezoelectric film so that a plurality of resonance regions are located within the acoustic reflection layer in plan view so as to share the acoustic reflection layer, one of the lower electrode and the upper electrode being divided, another one of the lower electrode and the upper electrode being not divided, the lower electrode and the upper electrode facing each other across at least a part of the piezoelectric film in each of the plurality of resonance regions; and an insertion film located between the lower electrode and the upper electrode and located in at least a part of an outer peripheral region of each of the plurality of resonance regions in plan view, the insertion film being not located in a center region of each of the plurality of resonance regions.

According to a second aspect of the present invention, there is provided an acoustic wave device including: a substrate; a piezoelectric film located on the substrate and an air gap, the air gap being located in or on the substrate; and a lower electrode and an upper electrode located on the substrate and the air gap so as to sandwich the piezoelectric film so that a region in which at least one of the lower electrode and the upper electrode is located in plan view substantially entirely overlaps with the air gap in plan view and a plurality of resonance regions are located within the air gap in plan view so as to share the air gap, one of the lower electrode and the upper electrode being divided, another one of the lower electrode and the upper electrode being not divided, the lower electrode and the upper electrode facing each other across at least a part of the piezoelectric film in each of the plurality of resonance regions.

DETAILED DESCRIPTION

Figure 1A:
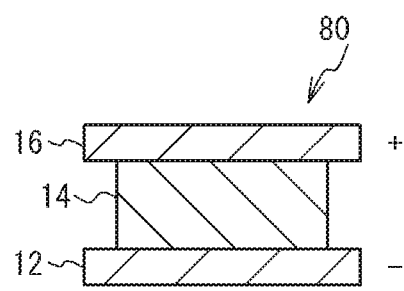
FIG. 1A and FIG. 1B are cross-sectional views of a piezoelectric thin film resonator.
Figure 1B:
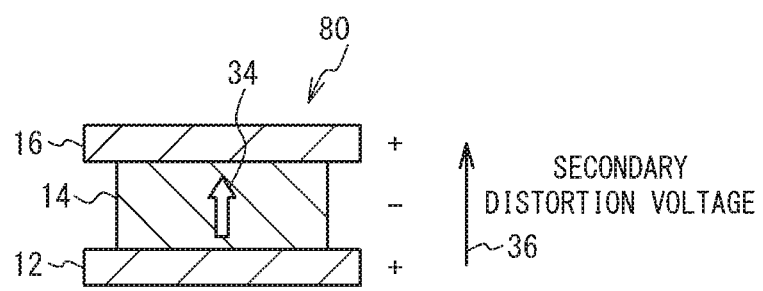

A description will be first given of an example for reducing the secondary distortion of a piezoelectric thin film resonator. FIG. 1A and FIG. 1B are cross-sectional views of a piezoelectric thin film resonator. As illustrated in FIG. 1A, a piezoelectric film 14 is sandwiched between a lower electrode 12 and an upper electrode 16. In a piezoelectric thin film resonator 80, ½ of the wavelength λ of the resonant frequency approximately corresponds to the thickness of the piezoelectric film 14. That is, the piezoelectric thin film resonator 80 uses ½λ thickness resonance. Thus, for example, when the lower electrode 12 polarizes negative (−), the upper electrode 16 polarizes positive (+). One of the upper and lower surfaces in the piezoelectric film 14 polarizes positive (+), and the other polarizes negative (−).

As illustrated in FIG. 1B, the wavelength of the frequency of the secondary distortion approximately corresponds to the thickness of the piezoelectric film 14. Thus, an acoustic wave is excited so that the upper and lower surfaces of the piezoelectric film 14 polarize positive (+) or negative (−), and the center of the piezoelectric film 14 polarizes negative (−) or positive (+). When the piezoelectric film 14 is symmetric in the vertical direction, the secondary distortions of the upper electrode 16 and the lower electrode 12 have the same electric potential. Thus, the secondary distortion component is not produced. However, when the piezoelectric film 14 is made of, for example, aluminum nitride (AlN) or zinc oxide (ZnO), the piezoelectric film 14 is oriented in the c-axis orientation to obtain good characteristics. The arrow indicates a c-axis orientation direction 34. At this time, the symmetry of the c-axis orientation in the piezoelectric film 14 is distorted, and the electric field has uneven distributions. The uneven distribution of the electric field generates the electric potential difference between the upper electrode 16 and the lower electrode 12. The voltage produced by the secondary distortion is called a secondary distortion voltage. When the direction from the lower electrode 12 to the upper electrode 16 corresponds to the c-axis orientation direction 34, a secondary distortion voltage 36 is produced in the same direction as the c-axis orientation direction 34.

Figure 2A:
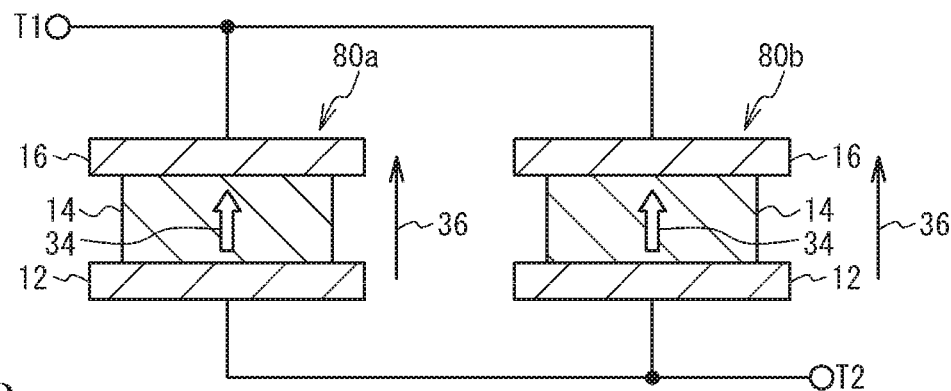
FIG. 2A and FIG. 2B illustrate piezoelectric thin film resonators divided in parallel.
Figure 2B:
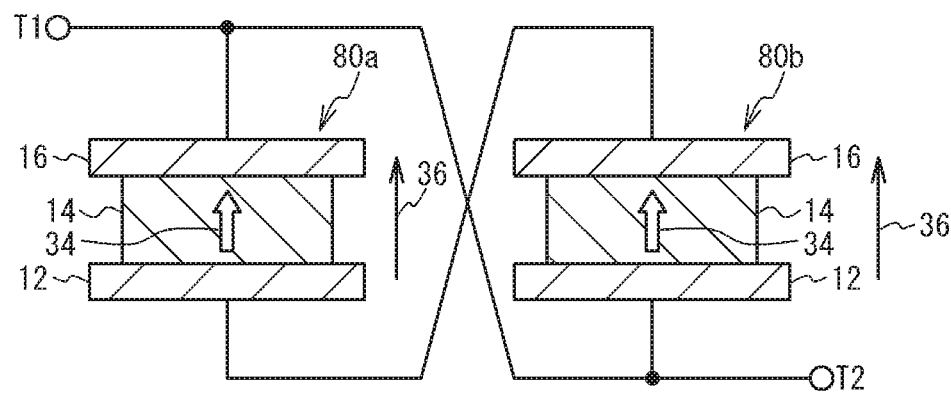
Figure 2C:
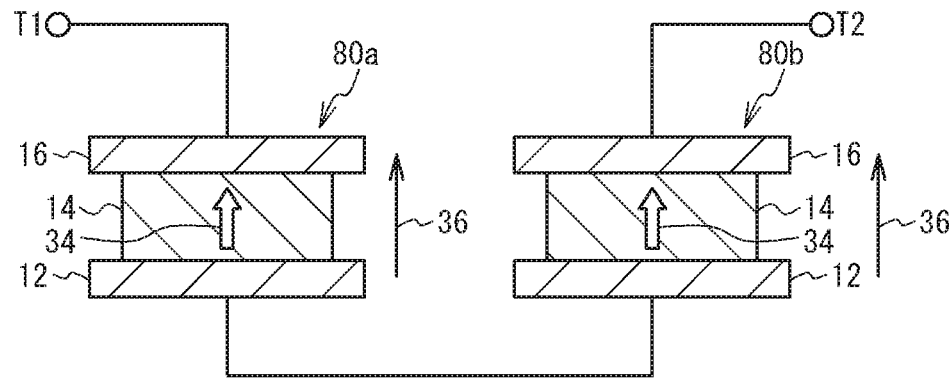
FIG. 2C illustrates piezoelectric thin film resonators divided in series.

FIG. 2A and FIG. 2B illustrate piezoelectric thin film resonators divided in parallel, and FIG. 2C illustrates piezoelectric thin film resonators divided in series. In FIG. 2A and FIG. 2B, the piezoelectric thin film resonator 80 is divided into piezoelectric thin film resonators 80a and 80b in parallel between terminals T1 and T2. The piezoelectric thin film resonators 80a and 80b are divided so as to have the same electrostatic capacitance.

In FIG. 2A, the upper electrodes 16 of the piezoelectric thin film resonators 80a and 80b are coupled to the terminal T1, and the lower electrodes 12 are coupled to the terminal T2. This structure causes the directions of the secondary distortion voltages 36 applied to the terminals T1 and T2 to be the same. Thus, the sum of the secondary distortion voltages 36 of the piezoelectric thin film resonators 80a and 80b is applied between the terminals T1 and T2. In FIG. 2B, the upper electrode 16 of the piezoelectric thin film resonator 80a and the lower electrode 12 of the piezoelectric thin film resonator 80b are coupled to the terminal T1, and the lower electrode 12 of the piezoelectric thin film resonator 80a and the upper electrode 16 of the piezoelectric thin film resonator 80b are coupled to the terminal T2. That is, the electrodes in the direction opposite to the c-axis orientation direction 34 are connected to each other. This structure causes the piezoelectric thin film resonators 80a and 80b to be coupled to the terminals T1 and T2 so that the directions of the secondary distortion voltages 36 are opposite to each other. Accordingly, the secondary distortion voltages 36 of the piezoelectric thin film resonators 80a and 80b cancel out each other. Therefore, the secondary distortion voltages applied to the terminals T1 and T2 are reduced.

As illustrated in FIG. 2C, the piezoelectric thin film resonator 80 is serially divided into the piezoelectric thin film resonators 80a and 80b between the terminals T1 and T2. The upper electrodes 16 of the piezoelectric thin film resonators 80a and 80b are respectively coupled to the terminals T1 and T2, and the lower electrodes 12 of the piezoelectric thin film resonators 80a and 80b are coupled to each other. That is, the electrodes in the c-axis orientation directions 34 are coupled to each other. Accordingly, the secondary distortion voltages 36 of the piezoelectric thin film resonators 80a and 80b cancel out each other. Thus, the secondary distortion voltages applied to the terminals T1 and T2 are reduced. The c-axis orientation direction 34 of the piezoelectric film 14 may be the polarization direction of the piezoelectric film 14.

A description will be given of a first comparative example in which the secondary distortion voltages 36 cancel out each other as illustrated in FIG. 2B and FIG. 2C.

FIRST COMPARATIVE EXAMPLE

Figure 3A:
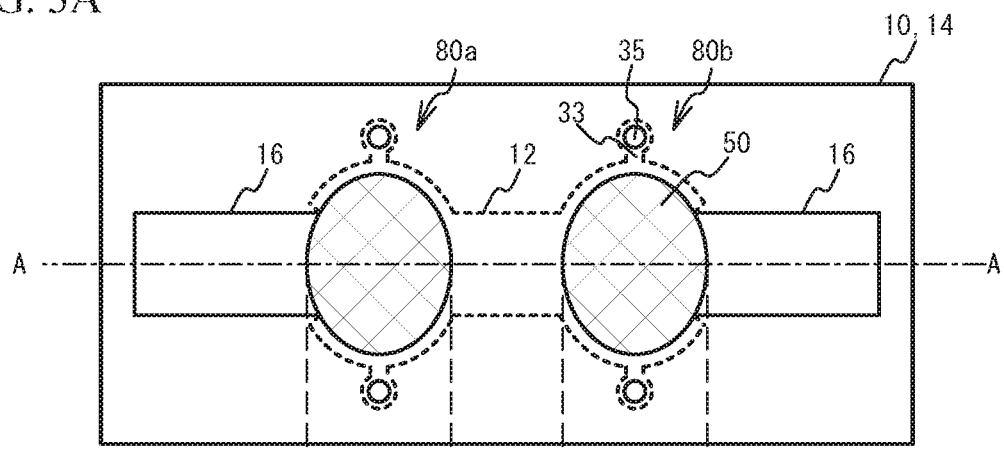
FIG. 3A is a plan view of an acoustic wave device in accordance with a first comparative example.
Figure 3B:
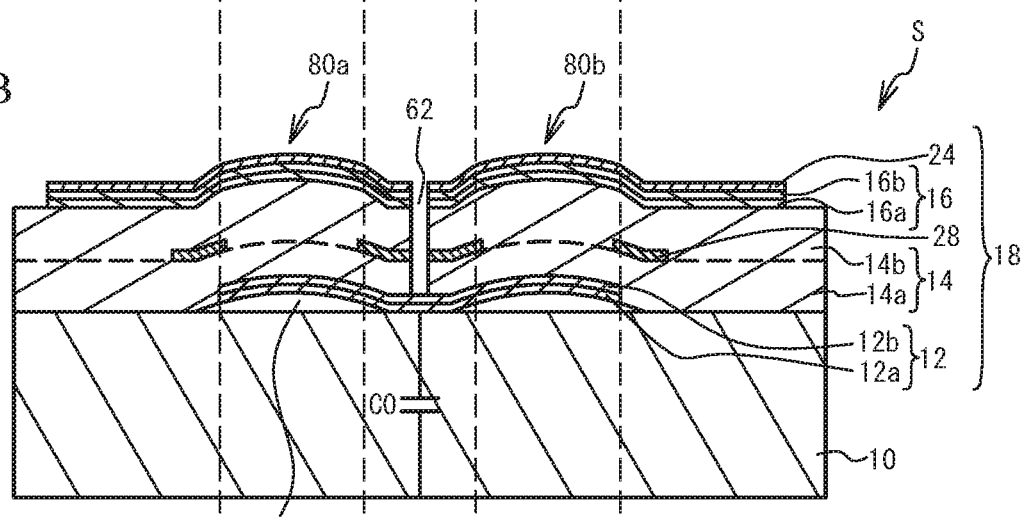
FIG. 3B and FIG. 3C are cross-sectional views taken along line A-A in FIG. 3A.
Figure 3C:
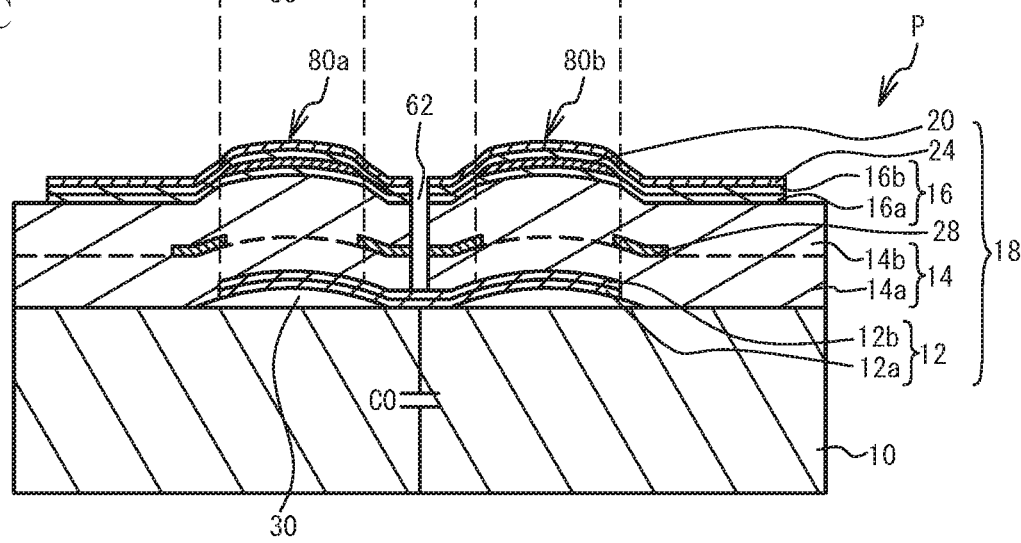

FIG. 3A is a plan view of an acoustic wave device in accordance with the first comparative example, and FIG. 3B and FIG. 3C are cross-sectional views taken along line A-A in FIG. 3A. FIG. 3B illustrates, for example, a series resonator of a ladder-type filter, and FIG. 3C illustrates, for example, a parallel resonator of the ladder-type filter.

As illustrated in FIG. 3A through FIG. 3C, the lower electrode 12, the piezoelectric film 14, the upper electrode 16, and a frequency adjusting film 24 are stacked on a substrate 10 in this order from the substrate 10 side. The lower electrode 12 includes a lower layer 12a and an upper layer 12b. The upper electrode 16 includes a lower layer 16a and an upper layer 16b. The piezoelectric film 14 includes a lower piezoelectric film 14a and an upper piezoelectric film 14b. An insertion film 28 is located between the lower piezoelectric film 14a and the upper piezoelectric film 14b. The insertion film 28 is located in an outer peripheral region of the resonance region 50. An air gap 30 is located between the substrate 10 and the lower electrode. In the parallel resonator illustrated in FIG. 3C, a mass load film 20 is located between the lower and upper layers 16a and 16b of the upper electrode 16. In a series resonator S, a multilayered film 18 is mainly formed of the lower electrode 12, the piezoelectric film 14, the upper electrode 16, and the frequency adjusting film 24. The multilayered film 18 of a parallel resonator P includes the mass load film 20 in addition to the multilayered film 18 of the series resonator S.

Two piezoelectric thin film resonators 80a and 80b are coupled through the lower electrode 12. Each of the piezoelectric thin film resonators 80a and 80b has the corresponding air gap 30. One resonance region 50 is located in one air gap 30. The upper electrode 16, the piezoelectric film 14, and the insertion film 28 between the resonance regions 50 are divided, and a divided region 62 is formed.

In the first comparative example, the lower electrode 12 between the resonance region 50 of the piezoelectric thin film resonator 80a and the resonance region 50 of the piezoelectric thin film resonator 80b is located on the substrate 10 without the air gap 30 being formed. Thus, a parasitic capacitance C0 is produced between the lower electrode 12 and a ground pattern (for example, a ground pattern such as a ground terminal and a ground wiring line formed on a chip on which the piezoelectric thin film resonators 80a and 80b are formed, a metal layer such as solder formed on the side surface or rear surface of the chip, and a ground pattern of a package on which the chip is mounted).

Simulated was the secondary distortion voltage of when the piezoelectric thin film resonator is serially divided as illustrated in FIG. 2C. The secondary distortion voltage was calculated based on a non-linear current that is proportional to "the square of the electric field intensity" applied to the piezoelectric films 14 of the piezoelectric thin film resonators 80a and 80b, "the product of the electric field intensity and the strain", and "the square of the strain". The piezoelectric film 14 was assumed to be an aluminum nitride film oriented in the c-axis orientation, and the piezoelectric thin film resonators 80a and 80b were assumed to have the same electrostatic capacitance and the same structure of the multilayered film 18. Calculated was the magnitude of the secondary distortion output from one of the terminals T1 and T2 when a high-frequency signal of 28 dBm was input to the other.

Figure 4:
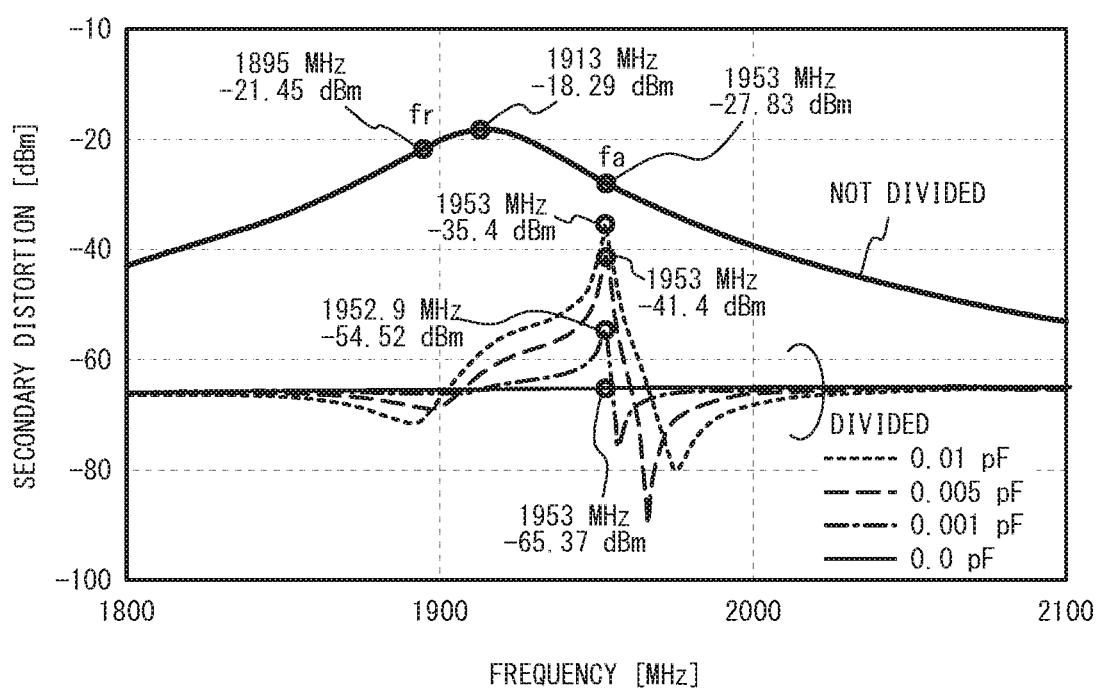
FIG. 4 is a graph of secondary distortion versus frequency.

FIG. 4 is a graph of secondary distortion versus frequency. In FIG. 4, "NOT DIVIDED" indicates the secondary distortion of the piezoelectric thin film resonator that is not divided. "DIVIDED" indicates the secondary distortion of the piezoelectric thin film resonator that was divided into the piezoelectric thin film resonators 80a and 80b. For "DIVIDED", the parasitic capacitance C0 between the lower electrode 12 between the piezoelectric thin film resonators 80a and 80b and a ground was changed from 0 pF to 0.01 pF.

As illustrated in FIG. 4, in the piezoelectric thin film resonator that is not divided, the secondary distortion at 1895 MHz, which is the resonant frequency fr, is −21.45 dBm, and the secondary distortion at 1953 MHz, which is the antiresonant frequency fa, is −27.83 dBm. The secondary distortion takes the greatest value of −18.29 dBm at 1913 MHz. In the divided piezoelectric thin film resonator, when the parasitic capacitance C0 is 0 pF, the secondary distortion is very small and −65.37 dBm. When the parasitic capacitance C0 is 0.001 pF, 0.005 pF, and 0.01 pF, the secondary distortion takes the maximum value around the antiresonant frequency, and is −54.52 dBm, −41.4 dBm, and −35.4 dBm, respectively. As described above, as the parasitic capacitance C0 increases, the peak of the secondary distortion voltage produced around the antiresonant frequency increases.

In the first comparative example, the lower electrode 12 between the resonance regions 50 is in contact with the substrate 10. Thus, the parasitic capacitance C0 between the lower electrode 12 and a ground is large. The large parasitic capacitance C0 causes the difference in antiresonant frequency between the piezoelectric thin film resonators 80a and 80b. As described above, when the piezoelectric thin film resonators 80a and 80b have different antiresonant frequencies fa, the secondary distortions are not completely cancelled, and the peak of the secondary distortion is formed around the antiresonant frequency fa. Therefore, the reduction of the secondary distortion is difficult.

Furthermore, to reduce the secondary distortion, the characteristics of the piezoelectric thin film resonators 80a and 80b are preferably the same. However, in the first comparative example, the distance between the piezoelectric thin film resonators 80a and 80b is long. This makes the film thickness of each layer in the multilayered film 18 of the piezoelectric thin film resonator 80a different from that of the piezoelectric thin film resonator 80b. This deteriorates the secondary distortion.

Hereinafter, a description will be given of a first embodiment.

First Embodiment

Figure 5A:
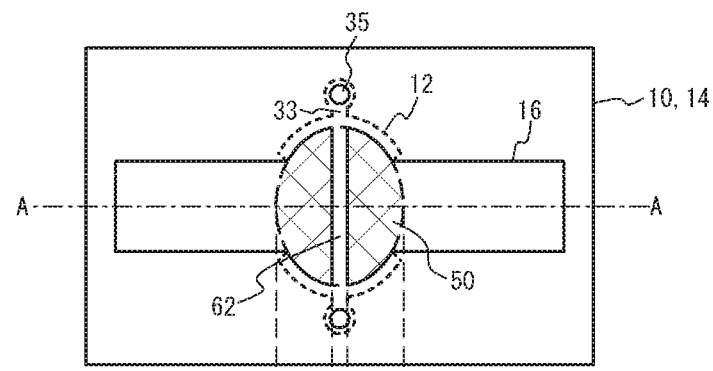
FIG. 5A is a plan view of an acoustic wave device in accordance with a first embodiment.
Figure 5B:
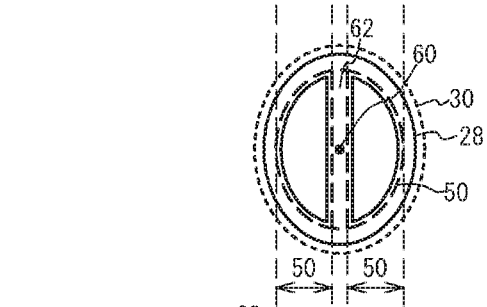
FIG. 5B is a plan view around a resonance region.
Figure 5C:
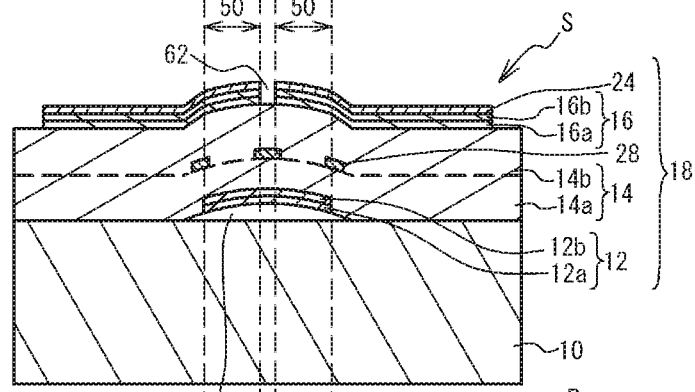
FIG. 5C and FIG. 5D are cross-sectional views taken along line A-A in FIG. 5A.
Figure 5D:
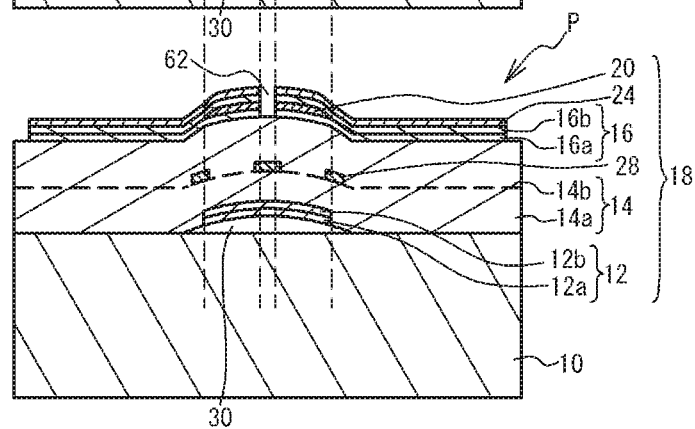

FIG. 5A is a plan view of an acoustic wave device in accordance with the first embodiment, FIG. 5B is a plan view around the resonance region, and FIG. 5C and FIG. 5D are cross-sectional views taken along line A-A in FIG. 5A.

FIG. 5C illustrates, for example, a series resonator of a ladder-type filter, and FIG. 5D illustrates, for example, a parallel resonator of the ladder-type filter.

With reference to FIG. 5A, FIG. 5B, and FIG. 5D, the structure of the series resonator S will be described. The lower electrode 12 is located on the substrate 10, which is a silicon (Si) substrate, and the air gap 30. The lower electrode 12 includes the lower layer 12a formed of a chrome (Cr) film and the upper layer 12b formed of a ruthenium (Ru) film. The air gap 30 (air layer) having a dome-shaped bulge is formed between the flat principal surface of the substrate 10 and the lower electrode 12. The dome-shaped bulge is, for example, a bulge having a shape in which the height of the air gap 30 is low near the periphery of the air gap 30 and increases at closer distances to the center of the air gap 30.

Located on the lower electrode 12 is the piezoelectric film 14 mainly composed of aluminum nitride (AlN) having the main axis in the (002) direction. The piezoelectric film 14 includes the lower piezoelectric film 14a and the upper piezoelectric film 14b. The insertion film 28 is located between the lower piezoelectric film 14a and the upper piezoelectric film 14b. Located on the piezoelectric film 14 is the upper electrode 16. The divided region 62 in which the upper electrode 16 is divided is located. The upper electrode 16 includes the lower layer 12a formed of a Ru film and the upper layer 16b formed of a Cr film.

The region where the lower electrode 12 and the upper electrode 16 face each other across at least a part of the piezoelectric film 14 is the resonance region 50. The region where the upper electrode 16 is divided is the divided region 62. Because of the divided region 62, two resonance regions 50 are formed within the single air gap 30. The resonance region 50 has a semi-elliptical shape, and is a region in which the acoustic wave in the thickness extension mode resonates. The resonance region 50 is located so as to be the same as or smaller than the air gap 30 and overlap with the air gap 30.

A silicon oxide film as the frequency adjusting film 24 is formed on the upper electrode 16. The multilayered film 18 in the resonance region 50 includes the lower electrode 12, the piezoelectric film 14, the upper electrode 16, and the frequency adjusting film 24. The frequency adjusting film 24 may act as a passivation film.

As illustrated in FIG. 5A, a hole portion 35 is located in the piezoelectric film 14 and the lower electrode 12. The hole portion 35 is communicated with the air gap 30 through an introduction path 33 under the lower electrode 12. The hole portion 35 and the introduction path 33 are used to introduce an etching liquid to a sacrifice layer for forming the air gap 30 when the sacrifice layer is etched.

With reference to FIG. 5D, the structure of the parallel resonator P will be described. The parallel resonator P differs from the series resonator S in that the mass load film 20 made of a titanium (Ti) layer is located between the lower and upper layers 16a and 16b of the upper electrode 16. Thus, the multilayered film 18 includes the mass load film 20 formed across the entire surface in the resonance region 50 in addition to the multilayered film of the series resonator S. Other structures are the same as those of the series resonator S illustrated in FIG. 5C, and the description thereof is thus omitted.

The difference in resonant frequency between the series resonator S and the parallel resonator P is adjusted with the film thickness of the mass load film 20. The resonant frequency of each of the series resonator S and the parallel resonator P is adjusted by adjusting the film thickness of the corresponding frequency adjusting film.

Figure 6A:
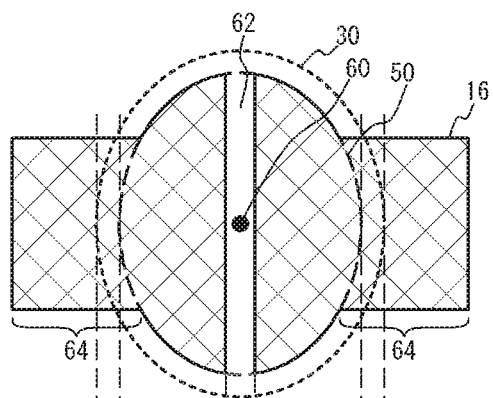
FIG. 6A through FIG. 6C are plan views enlarging the vicinity of the resonance region in the first embodiment.
Figure 6B:
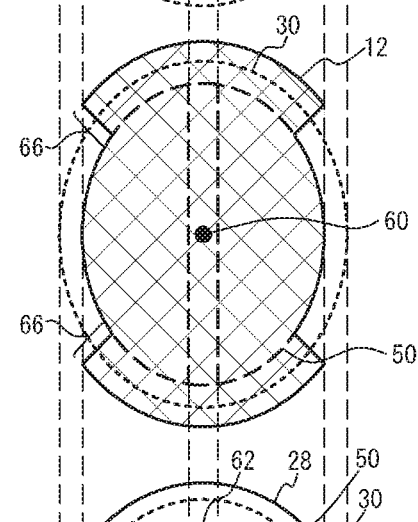
Figure 6C:
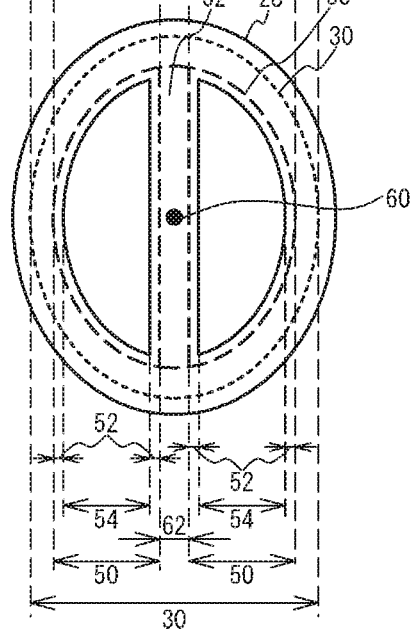

FIG. 6A through FIG. 6C are plan views that enlarge the vicinity of the resonance region in the first embodiment. FIG. 6A is a plan view illustrating a positional relation among the upper electrode 16, the resonance region 50, and the air gap 30, and indicates the upper electrode 16 with cross-hatching. FIG. 6B is a plan view illustrating a positional relation among the lower electrode 12, the resonance region 50, and the air gap 30, and indicates the lower electrode 12 by cross-hatching. FIG. 6C is a plan view illustrating a positional relation among the insertion film 28, the resonance region 50, and the air gap 30.

As illustrated in FIG. 6A, the air gap 30 has an elliptical shape, and the upper electrode 16 has extraction regions 64 in the minor axis direction. The extraction region 64 is a region to which the upper electrode 16 is extracted from the resonance region 50. The upper electrode 16 is divided along the major axis of the elliptical shape of the air gap 30. The region where the upper electrode 16 is not located is the divided region 62. The divided region 62 includes a center 60 of the elliptical shape. In the region other than the extraction regions 64, the upper electrode 16 defines the resonance region 50.

As illustrated in FIG. 6B, the lower electrode 12 has no extraction region. The lower electrode 12 has wide portions 66 in the major axis direction of the air gap 30. The wide portion 66 is formed to the outside of the air gap 30. The lower electrode 12 is also located in the divided region 62. In the region other than the wide portions 66 and the divided region 62, the lower electrode 12 defines the resonance region 50.

The resonance regions 50 are located at both sides of the divided region 62. The combined planar shape of the resonance regions 50 and the divided region 62 is similar to the shape of the air gap 30, and is included in the air gap 30. In plan view, the combined planar shape of the resonance regions 50 and the divided region 62 may be congruent to the shape of the air gap 30 and overlap with the air gap 30.

As illustrated in FIG. 6C, the insertion film 28 is located in outer peripheral regions 52 within the resonance regions 50, and is not located in center regions 54. The divided region 62 is included in the insertion film 28. The outer peripheral region 52 is located within the resonance region 50, includes the outer periphery of the resonance region 50, and is located along the outer periphery. The outer peripheral region 52 has, for example, a strip shape. The center region 54 is located within the resonance region 50, and includes the center of the resonance region 50. The center may not be necessarily the geometric center. The insertion film 28 is continuously located from the outer peripheral regions 52 to the outside of the resonance regions 50. As illustrated in FIG. 6C, the outer periphery of the insertion film 28 may be located further out than the outer periphery of the air gap 30, or further in than as illustrated in FIG. 5B.

When the piezoelectric thin film resonator has a resonant frequency of 2 GHz, the lower layer 12a of the lower electrode 12 is a Cr film with a film thickness of 100 nm, and the upper layer 12b is a Ru film with a film thickness of 250 nm. The piezoelectric film 14 is an AlN film with a film thickness of 1100 nm. The insertion film 28 is a silicon oxide (SiO$_2$) film with a film thickness of 150 nm. The lower layer 16a of the upper electrode 16 is a Ru film with a film thickness of 250 nm, and the upper layer 16b is a Cr film with a film thickness of 50 nm. The frequency adjusting film 24 is a silicon oxide film with a film thickness of 50 nm. The mass load film 20 is a Ti film with a film thickness of 120 nm. The film thickness of each layer can be appropriately set to achieve desired resonance characteristics.

The substrate 10 may be a sapphire substrate, a spinel substrate, an alumina substrate, a quartz substrate, a glass substrate, a ceramic substrate, or a GaAs substrate instead of a Si substrate. The lower electrode 12 and the upper electrode 16 may be formed of a single-layer film of Al, Ti, Cu, molybdenum (Mo), tungsten (W), Ta, Pt, rhodium (Rh), or iridium (Ir) instead of Ru and Cr, or a multilayered film of at least two of them. For example, the lower layer 16a of the upper electrode 16 may be made of Ru, and the upper layer 16b may be made of Mo.

The piezoelectric film 14 may be made of zinc oxide (ZnO), lead zirconate titanate (PZT), and lead titanate (PbTiO$_3$) instead of aluminum nitride. Alternatively, for example, the piezoelectric film 14 may be mainly composed of aluminum nitride, and contain other elements for improving the resonance characteristics or the piezoelectricity. For example, the use of scandium (Sc), a II-group element and a IV-group element, or a II-group element and a V-group element as additive elements improves the piezoelectricity of the piezoelectric film 14, improving the effective electromechanical coupling coefficient of the piezoelectric thin film resonator. The II-group element is, for example, calcium (Ca), magnesium (Mg), strontium (Sr), or zinc (Zn). The IV-group element is, for example, Ti, zirconium (Zr), or hafnium (Hf). The V-group element is, for example, Ta, niobium (Nb), or vanadium (V). Furthermore, the piezoelectric film 14 may be mainly composed of aluminum nitride, and contain boron (B).

The frequency adjusting film 24 may be a silicon nitride film or made of aluminum nitride instead of a silicon oxide film. The mass load film 20 may be a single-layer film of Ru, Cr, Al, Cu, Mo, W, Ta, Pt, Rh, or Ir instead of Ti. Alternatively, an insulating film made of, for example, metal nitride such as silicon nitride or metal oxide such as silicon oxide may be used. The mass load film 20 may be formed below the lower electrode 12, between the layers of the lower electrode 12, on the upper electrode 16, between the lower electrode 12 and the piezoelectric film 14, or between the piezoelectric film 14 and the upper electrode 16 instead of between the layers of the upper electrode 16 (between the Ru film and the Cr film). The mass load film 20 may be larger than the resonance region 50 as long as it is formed so as to include the resonance region 50.

As described in Patent Document 3, Young's modulus of the insertion film 28 is preferably less than that of the piezoelectric film 14. When the densities are approximately the same, the acoustic impedance of the insertion film 28 is preferably less than that of the piezoelectric film 14 since Young's modulus correlates with the acoustic impedance. This configuration improves the Q-value. In addition, use of a metal film for the insertion film 28 improves the effective electromechanical coupling coefficient. Furthermore, when the piezoelectric film 14 is mainly composed of aluminum nitride, the insertion film 28 is preferably an Al film, a gold (Au) film, a copper (Cu) film, a Ti film, a platinum (Pt) film, a tantalum (Ta) film, a Cr film, or a silicon oxide film to make the acoustic impedance of the insertion film 28 less than that of the piezoelectric film 14. Especially in consideration of Young's modulus, the insertion film 28 is preferably an Al film or a silicon oxide film.

Figure 7:
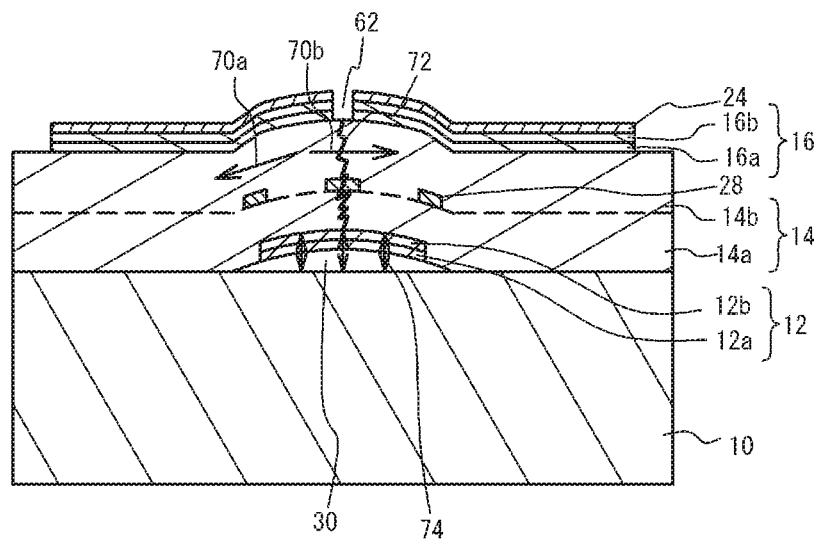
FIG. 7 is a cross-sectional view for describing an advantage of the first embodiment.

FIG. 7 is a cross-sectional view for describing an advantage of the first embodiment. As illustrated in FIG. 7, in the first embodiment, the upper electrode 16 is divided and the lower electrode 12 is not divided so that a plurality of resonance regions 50 are located within the air gap 30 in plan view to share the air gap 30. This structure forms the air gap 30 between the substrate 10 and the lower electrode 12 connecting the resonance regions 50. Thus, the parasitic capacitance C0 is reduced. For example, the secondary distortion can be reduced by applying this structure to the piezoelectric thin film resonators 80a and 80b divided as illustrated in FIG. 2B and FIG. 2C. To reduce the secondary distortion, the areas of the resonance regions 50 are preferably approximately the same.

In addition, the insertion film 28 is located between the lower electrode 12 and the upper electrode 16, is located in at least a part of the outer peripheral region 52 of each of the resonance regions 50 in plan view, and is not located in the center region 54 of each of the resonance regions 50. This structure reduces a leak 70a of the acoustic wave from the resonance region 50 to the outside. Furthermore, a leak 70b of the acoustic wave between the resonance regions 50 is reduced. Therefore, reduced is the deterioration of the characteristics including the Q-value of the piezoelectric thin film resonator.

The insertion film 28 overlaps with the divided region 62, and is not located in the center region 54 of each of the resonance regions 50. This structure reduces the leak 70b of the acoustic wave between the resonance regions 50, reducing the deterioration of the characteristics of the piezoelectric thin film resonator including the Q-value. In the divided region 62, the multilayered film 18 is thin, and thus, a crack 72 is easily formed in the multilayered film 18. The strength of the multilayered film 18 in the divided region 62 is increased by overlapping the insertion film 28 with the divided region 62. The insertion film 28 is preferably located so as to be larger than the divided region 62 and overlap with the divided region 62.

At the center 60 of the air gap 30, a large stress is applied to the multilayered film 18. For example, when the dome-shaped air gap 30 is formed, a displacement 74 of the multilayered film 18 becomes the greatest at the center 60 of the air gap 30. Thus, the crack 72 is easily formed. Therefore, the multilayered film 18 is formed so as to include the center 60 of the air gap 30 in plan view. This structure can reduce the mechanical fracture such as the crack 72 of the multilayered film 18. The center 60 of the air gap 30 is, for example, the center of gravity of the planar shape of the air gap 30.

It is sufficient if the insertion film 28 is located in at least a part of the outer peripheral region 52. However, the insertion film 28 is preferably located in a closed-loop fashion surrounding the center region 54 of each of the resonance regions 50. This structure reduces the leak of the acoustic wave from the resonance region 50 to the outside, and the leak of the acoustic wave between the resonance regions 50, further reducing the deterioration of the characteristics including the Q-value of the piezoelectric thin film resonator.

To reduce the leak of the acoustic wave to the outside of the resonance region 50, the width of the insertion film 28 in the resonance region 50 is preferably approximately ½ of the wavelength of the acoustic wave that leaks. As described above, there is a preferable value for the width of the insertion film 28 in the resonance region 50. Thus, the width of the insertion film 28 in the resonance region 50 is preferably substantially constant.

Furthermore, the insertion films 28 corresponding to a plurality of the resonance regions 50 are preferably a single insertion film. This structure can reduce the size of the acoustic wave device.

A description has been given of a case where the insertion film 28 is located in the piezoelectric film 14. However, it is sufficient if the insertion film 28 is located at least in the piezoelectric film 14, between the piezoelectric film 14 and the upper electrode 16, or between the piezoelectric film 14 and the lower electrode 12.

As illustrated in FIG. 6A and FIG. 6B, the region where at least one of the lower electrode and the upper electrode is located (the region where one of or both of the upper electrode 16 of the FIG. 6A and the lower electrode 12 of FIG. 6B are located) substantially entirely overlaps with the air gap 30 in plan view. This structure enhances the strength of the multilayered film 18. The term "substantially entirely overlap" means that two things substantially entirely overlap to the extent of the errors due to the production tolerance and/or two things are considered to substantially overlap even when the region between the extraction region 64 and the wide portion 66 is not included. The air gap 30 may substantially correspond to the combined region of the resonance regions 50 and the divided region 62.

First Variation of First Embodiment

Figure 8A:
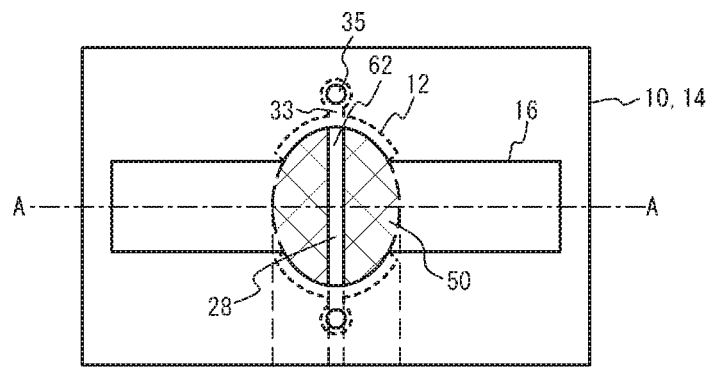
FIG. 8A is a plan view of an acoustic wave device in accordance with a first variation of the first embodiment.
Figure 8B:
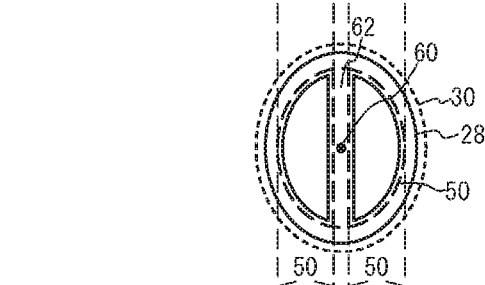
FIG. 8B is a plan view around the resonance region.
Figure 8C:
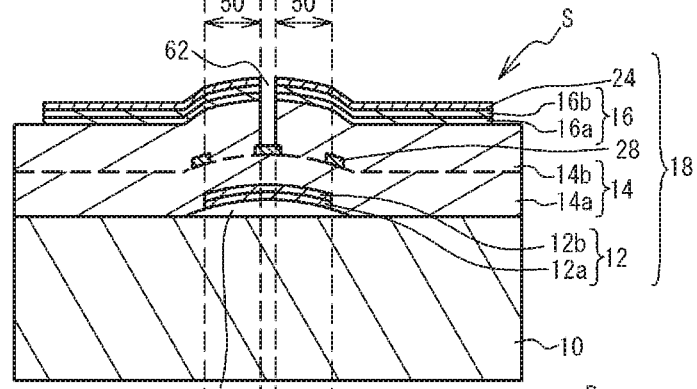
FIG. 8C and FIG. 8D are cross-sectional views taken along line A-A in FIG. 8A.
Figure 8D:
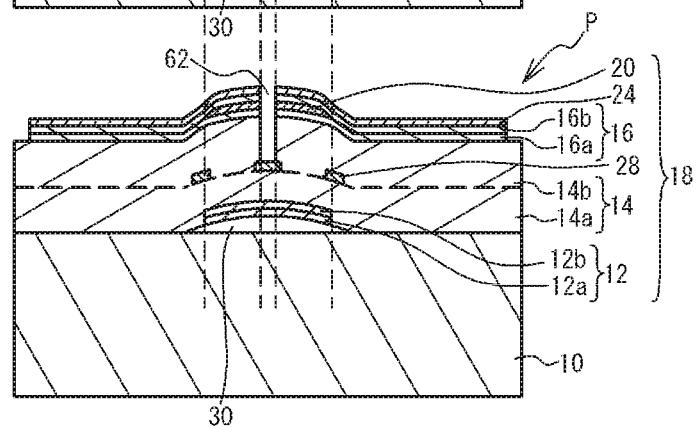

FIG. 8A is a plan view of an acoustic wave device in accordance with a first variation of the first embodiment, FIG. 8B is a plan view around the resonance region, and FIG. 8C and FIG. 8D are cross-sectional views taken along line A-A in FIG. 8A. As illustrated in FIG. 8A through FIG. 8D, in the divided region 62, the upper electrode 16 and the upper piezoelectric film 14*b* may be removed. Other structures are the same as those of the first embodiment, and the description thereof is thus omitted.

When the piezoelectric film 14 in the divided region 62 is entirely removed, the resonance region 50 is to be supported by the lower electrode 12. Thus, the lower electrode 12 can be easily damaged. Thus, a part of the piezoelectric film 14 in the divided region 62 is removed. This structure further reduces the leak of the acoustic wave between the resonance regions 50. The insertion film 28 is located in the divided region 62. The upper electrode 16 and the upper piezoelectric film 14*b* in the divided region 62 can be removed using the insertion film 28 as a stopper. Thus, a part of the piezoelectric film 14 can be precisely removed.

Second Variation of First Embodiment

Figure 9A:
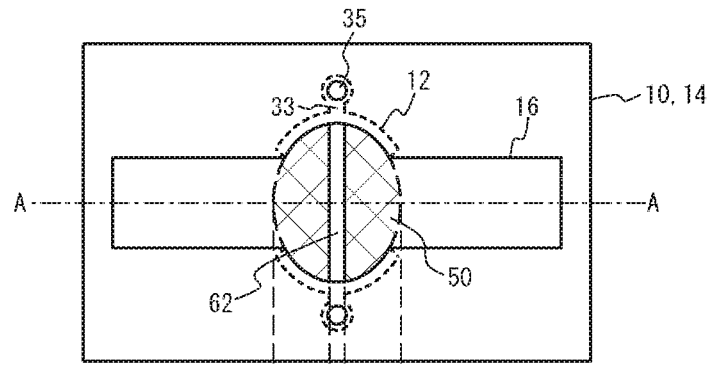
FIG. 9A is a plan view of an acoustic wave device in accordance with a second variation of the first embodiment.
Figure 9B:
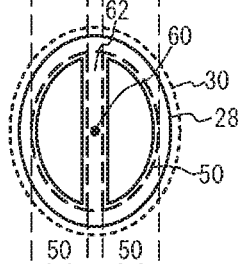
FIG. 9B is a plan view around the resonance region.
Figure 9C:
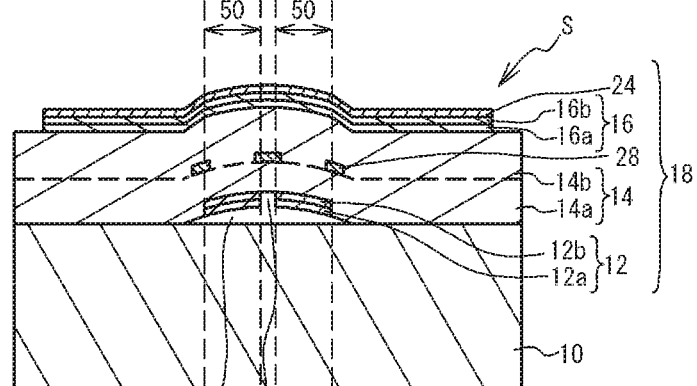
FIG. 9C and FIG. 9D are cross-sectional views taken along line A-A in FIG. 9A.
Figure 9D:
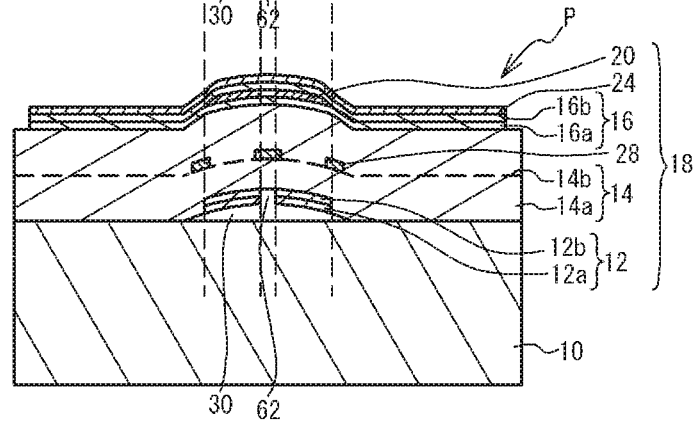

FIG. 9A is a plan view of an acoustic wave device in accordance with a second variation of the first embodiment, FIG. 9B is a plan view around the resonance region, and FIG. 9C and FIG. 9D are cross-sectional views taken along line A-A in FIG. 9A. As illustrated in FIG. 9A through FIG. 9D, in the divided region 62, the lower electrode 12 is divided, and the piezoelectric film 14 and the upper electrode 16 are not divided. Other structures are the same as those of the first embodiment, and the description thereof is thus omitted.

As described in the first embodiment and the second variation thereof, it is sufficient if one of the lower electrode 12 and the upper electrode 16 is divided and the other of the lower electrode 12 and the upper electrode 16 is not divided in the divided region 62.

Third Variation of First Embodiment

Figure 10A:
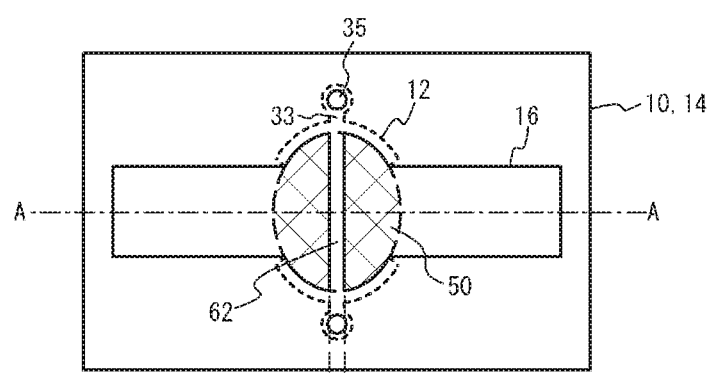
FIG. 10A is a plan view of an acoustic wave device in accordance with a third variation of the first embodiment.
Figure 10B:
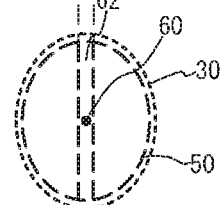
FIG. 10B is a plan view around the resonance region.
Figure 10C:
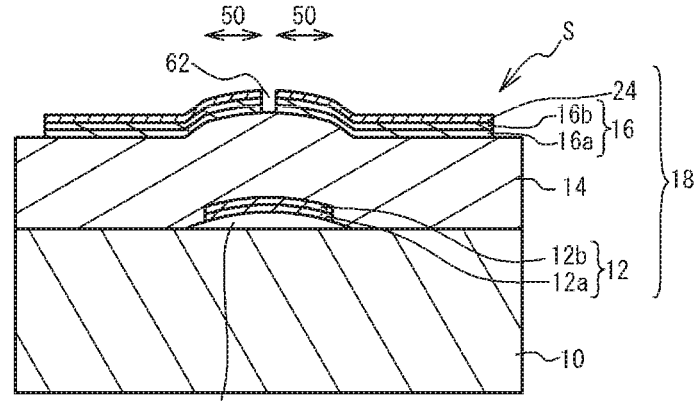
FIG. 10C and FIG. 10D are cross-sectional views taken along line A-A in FIG. 10A.
Figure 10D:
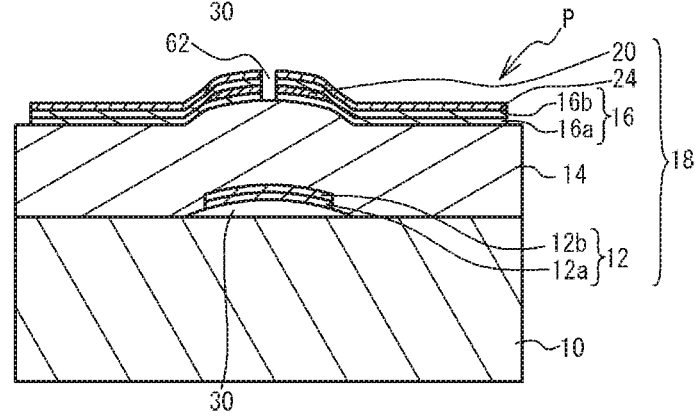

FIG. 10A is a plan view of an acoustic wave device in accordance with a third variation of the first embodiment, FIG. 10B is a plan view around the resonance region, and FIG. 10C and FIG. 10D are cross-sectional views taken along line A-A in FIG. 10A. As illustrated in FIG. 10A through FIG. 10D, no insertion film 28 is located. Other structures are the same as those of the first embodiment, and the description thereof is thus omitted.

When a plurality of resonance regions are located in an air gap in plan view as described in Patent Document 1 and there is a region where none of the lower electrode and the upper electrode is located in the air gap, the piezoelectric film is easily mechanically damaged. In the third variation of the first embodiment, the region where at least one of the lower electrode 12 and the upper electrode 16 is located substantially entirely overlaps with the air gap 30 in plan view. This structure allows the at least one of the lower electrode 12 and the upper electrode 16 to reinforce the piezoelectric film 14. Thus, the mechanical fracture of the multilayered film 18 is reduced.

Fourth Variation of First Embodiment

Figure 11A:
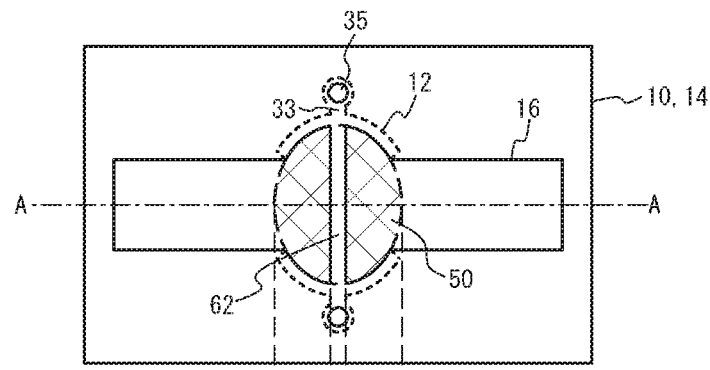
FIG. 11A is a plan view of an acoustic wave device in accordance with a fourth variation of the first embodiment.
Figure 11B:
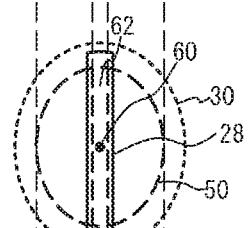
FIG. 11B is a plan view around the resonance region.
Figure 11C:
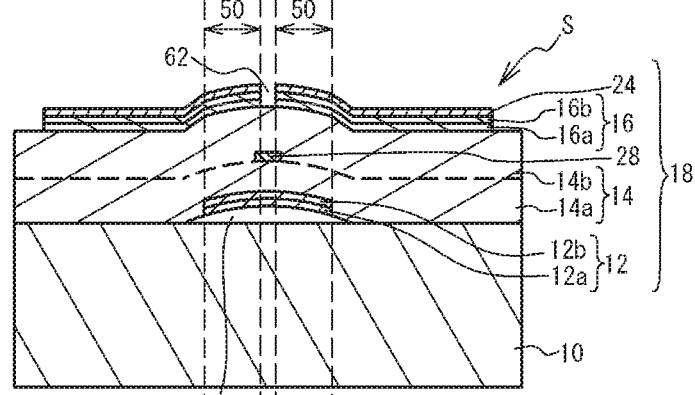
FIG. 11C and FIG. 11D are cross-sectional views taken along line A-A in FIG. 11A.
Figure 11D:
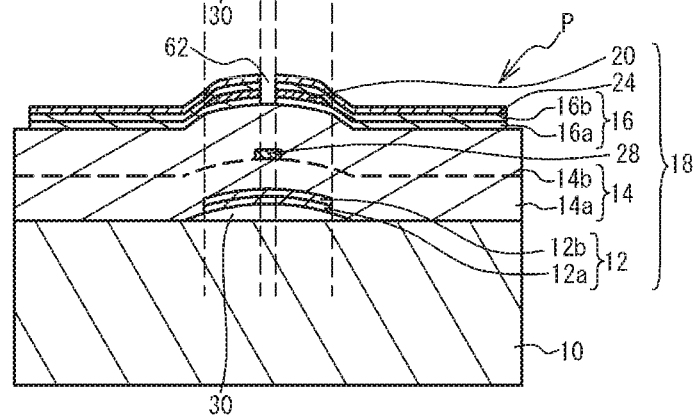

FIG. 11A is a plan view of an acoustic wave device in accordance with a fourth variation of the first embodiment, FIG. 11B is a plan view around the resonance region, and FIG. 11C and FIG. 11D are cross-sectional views taken along line A-A in FIG. 11A. As illustrated in FIG. 11A through FIG. 11D, the insertion film 28 is located in the divided region 62, but is not located other regions. Other structures are the same as those of the first embodiment, and the description thereof is thus omitted.

As described in the fourth variation of the first embodiment, the insertion film 28 may not be necessarily located in a region other than the divided region 62. As long as the insertion film 28 is located in the divided region 62, the leak 70*b* of the acoustic wave between the resonance regions 50 is reduced, and the deterioration of the characteristics of the piezoelectric thin film resonator including the Q-value is thereby reduced. Additionally, the strength of the multilayered film 18 in the divided region 62 is increased.

Fifth Variation of First Embodiment

Figure 12A:
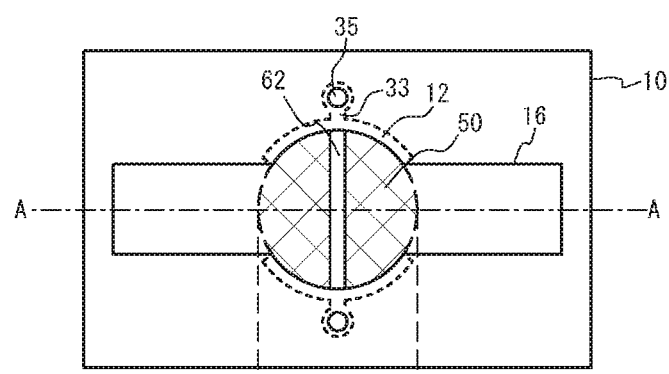
FIG. 12A is a plan view of an acoustic wave device in accordance with a fifth variation of the first embodiment.
Figure 12B:
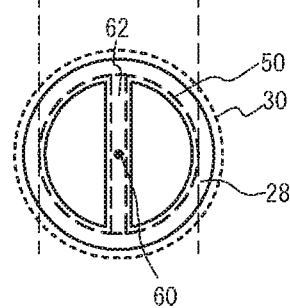
FIG. 12B is a plan view around the resonance region.

FIG. 12A is a plan view of an acoustic wave device in accordance with a fifth variation of the first embodiment, and FIG. 12B is a plan view around the resonance region. As illustrated in FIG. 12A and FIG. 12B, the planar shape of the air gap 30 is a circular shape, and the planar shape of the combined region of the resonance regions 50 and the divided region 62 is a circular shape. Other structures are the same as those of the first embodiment, and the description thereof is thus omitted.

Sixth Variation of First Embodiment

Figure 13A:
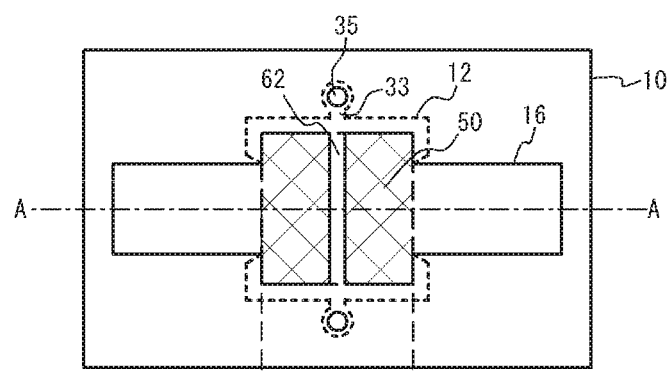
FIG. 13A is a plan view of an acoustic wave device in accordance with a sixth variation of the first embodiment.
Figure 13B:
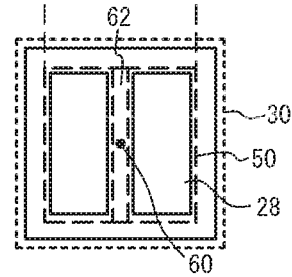
FIG. 13B is a plan view around the resonance region.

FIG. 13A is a plan view of an acoustic wave device in accordance with a sixth variation of the first embodiment, and FIG. 13B is a plan view around the resonance region. As illustrated in FIG. 13A and FIG. 13B, the planar shape of the air gap 30 is a quadrangle shape, and the planar shape of the combined region of the resonance regions 50 and the divided region 62 is a quadrangle shape. Other structures are the same as those of the first embodiment, and the description thereof is thus omitted.

Seventh Variation of First Embodiment

Figure 14A:
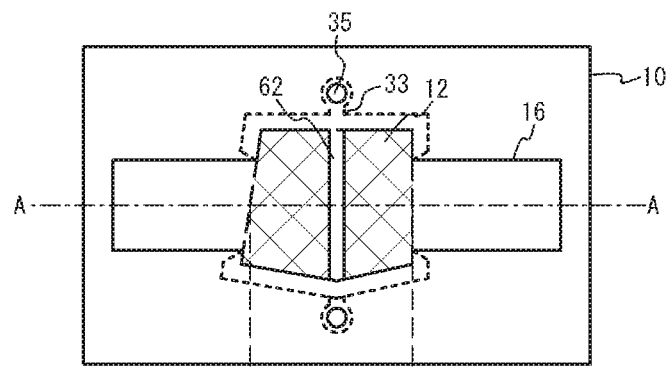
FIG. 14A is a plan view of an acoustic wave device in accordance with a seventh variation of the first embodiment.
Figure 14B:
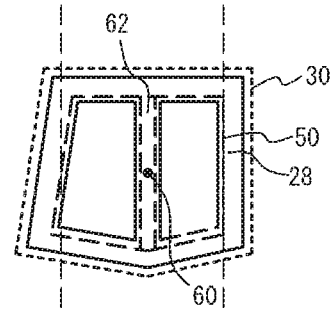
FIG. 14B is a plan view around the resonance region.

FIG. 14A is a plan view of an acoustic wave device in accordance with a seventh variation of the first embodiment, and FIG. 14B is a plan view around the resonance region. As illustrated in FIG. 14A and FIG. 14B, the planar shape of the air gap 30 is a pentagonal shape, and the planar shape of the combined region of the resonance regions 50 and the divided region 62 is a pentagonal shape. Other structures are the same as those of the first embodiment, and the description thereof is thus omitted.

As described in the fifth through seventh variations of the first embodiment, the planar shape of the air gap 30 and the planar shape of the combined region of the resonance regions 50 and the divided region 62 may be a circular shape or a polygonal shape. In the first through fourth variations of the first embodiment, the planar shape of the air gap 30 and the planar shape of the combined region of the resonance regions 50 and the divided region 62 may be configured to be a circular shape or a polygonal shape. A description has been given of a case where the shape of the air gap 30 is similar to the shape of the combined region of the resonance regions 50 and the divided region 62, but they may not be necessarily similar.

Eighth Variation of First Embodiment

Figure 15A:
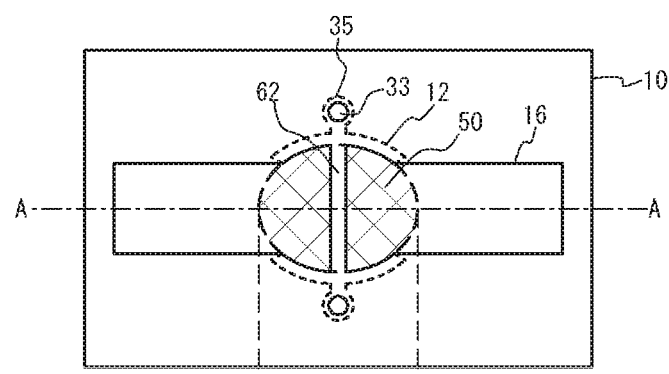
FIG. 15A is a plan view of an acoustic wave device in accordance with an eighth variation of the first embodiment.
Figure 15B:
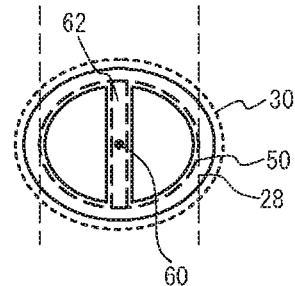
FIG. 15B is a plan view around the resonance region.

FIG. 15A is a plan view of an acoustic wave device in accordance with an eighth variation of the first embodiment, and FIG. 15B is a plan view around the resonance region. As illustrated in FIG. 15A and FIG. 15B, the planar shape of the air gap 30 and the planar shape of the combined region of the resonance regions 50 and the divided region 62 may be an elliptical shape, and the divided region 62 may be located along the minor axis. Other structures are the same as those of the first embodiment, and the description thereof is thus omitted. When an elliptical shape is divided into two along the minor axis, the aspect ratio of the resonance region 50 becomes close to 1. Thus, the spurious is reduced.

Ninth Variation of First Embodiment

Figure 16A:
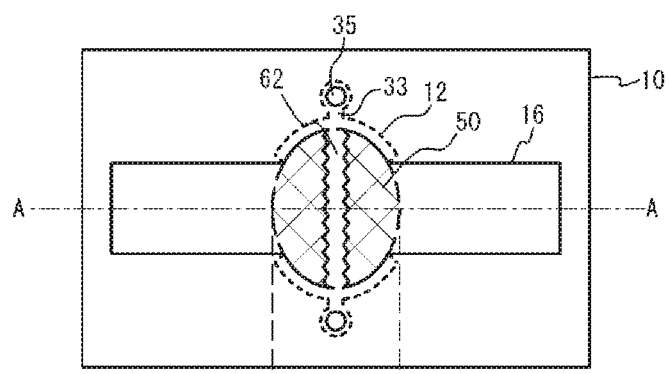
FIG. 16A is a plan view of an acoustic wave device in accordance with a ninth variation of the first embodiment.
Figure 16B:
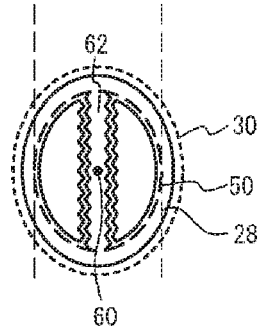
FIG. 16B is a plan view around the resonance region.

FIG. 16A is a plan view of an acoustic wave device in accordance with a ninth variation of the first embodiment, and FIG. 16B is a plan view around the resonance region. As illustrated in FIG. 16A and FIG. 16B, the boundary between the divided region 62 and the resonance region 50 is wavy. The outline of the insertion film 28 in the divided region 62 is wavy. Other structures are the same as those of the first embodiment, and the description thereof is thus omitted. The spurious is reduced by making the boundary between the divided region 62 and the resonance region 50 wavy.

Tenth Variation of First Embodiment

Figure 17A:
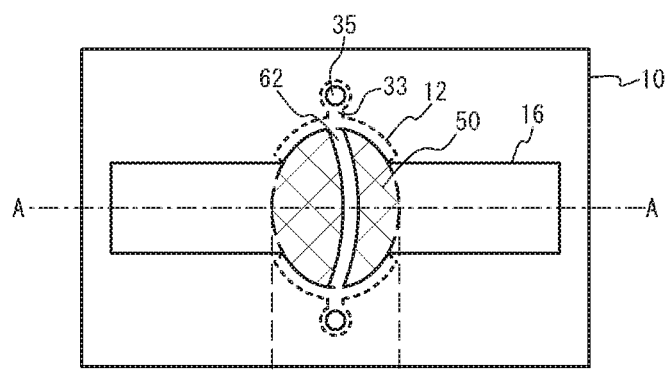
FIG. 17A is a plan view of an acoustic wave device in accordance with a tenth variation of the first embodiment.
Figure 17B:
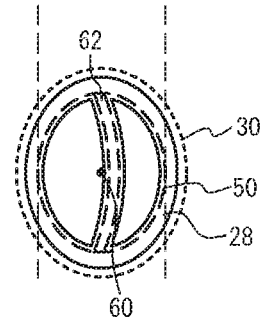
FIG. 17B is a plan view around the resonance region.

FIG. 17A is a plan view of an acoustic wave device in accordance with a tenth variation of the first embodiment, and FIG. 17B is a plan view around the resonance region. As illustrated in FIG. 17A and FIG. 17B, the divided region 62 is curved. The insertion film 28 along the divided region 62 is curved. Other structures are the same as those of the first embodiment, and the description thereof is thus omitted. The spurious is reduced by making the divided region 62 curved. When the center 60 of the air gap 30 is not included in the divided region 62, the center 60 may not be necessarily overlap with the insertion film 28.

Eleventh Variation of First Embodiment

Figure 18A:
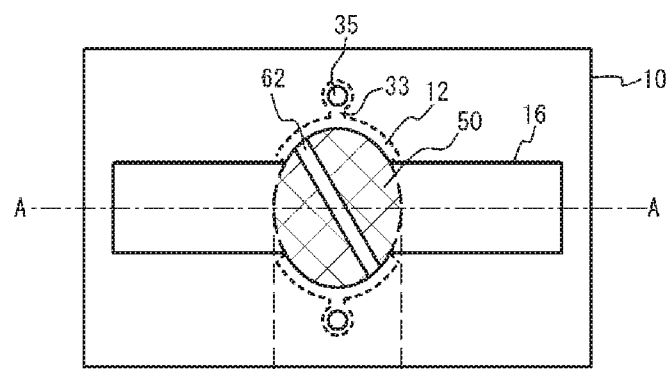
FIG. 18A is a plan view of an acoustic wave device in accordance with an eleventh variation of the first embodiment.
Figure 18B:
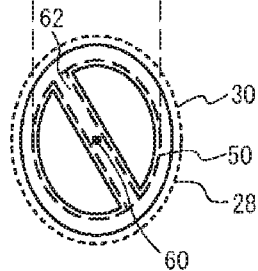
FIG. 18B is a plan view around the resonance region.

FIG. 18A is a plan view of an acoustic wave device in accordance with an eleventh variation of the first embodiment, and FIG. 18B is a plan view around the resonance region. As illustrated in FIG. 18A and FIG. 18B, the divided region 62 is inclined from the major axis and the minor axis. The insertion film 28 along the divided region 62 is inclined from the major axis and the minor axis. Other structures are the same as those of the first embodiment, and the description thereof is thus omitted. When the divided region 62 is inclined, the spurious is reduced.

The shape of the divided region 62 in the eighth through eleventh variations of the first embodiment may be applied to the first embodiment and the first through seventh variations thereof.

Twelfth Variation of First Embodiment

Figure 19A:
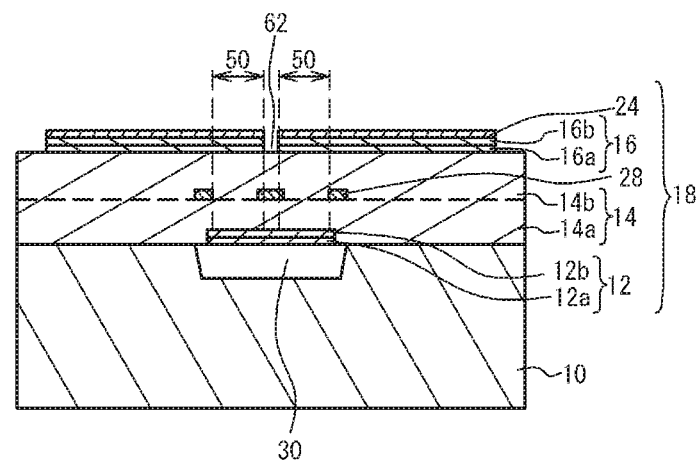
FIG. 19A and FIG. 19B are cross-sectional views of the vicinity of the resonance region in twelfth and thirteenth variations of the first embodiment, respectively.
Figure 19B:
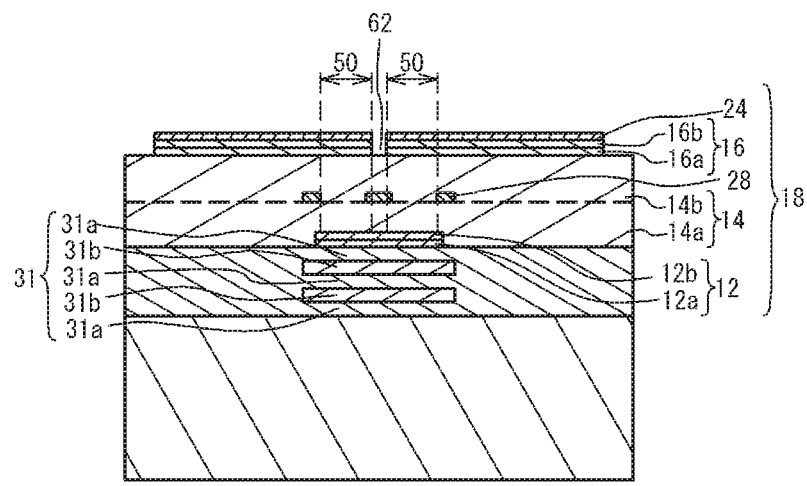

Twelfth and thirteenth variations of the first embodiment change the structure of the air gap. FIG. 19A and FIG. 19B are cross-sectional views around the resonance region in the twelfth and thirteenth variations of the first embodiment. As illustrated in FIG. 19A, a recessed portion is formed on the upper surface of the substrate 10. The lower electrode 12 is flatly formed on the substrate 10. This structure forms the air gap 30 in the recessed portion of the substrate 10. The air gap 30 is formed so as to include the resonance region 50. Other structures are the same as those of the first embodiment, and the description thereof is thus omitted. The air gap 30 may be formed so as to penetrate through the substrate 10. An insulating film may be formed so as to be in contact with the lower surface of the lower electrode 12. That is, the air gap 30 may be formed between the substrate 10 and the insulating film being in contact with the lower electrode 12. The insulating film is, for example, an aluminum nitride film.

Thirteenth Variation of First Embodiment

As illustrated in FIG. 19B, an acoustic mirror 31 is formed below the lower electrode 12 in the resonance region 50. The acoustic mirror 31 includes a film 31a with low acoustic impedance and a film 31b with high acoustic impedance alternately stacked. The film thickness of each of the films 31a and 31b is approximately, for example, $\lambda/4$ ($\lambda$ is the wavelength of the acoustic wave). The numbers of the films 31a and the films 31b stacked are freely selected. For example, the acoustic mirror 31 may have a structure in which one film with acoustic impedance different from that of the substrate 10 is located in the substrate 10. Other structures are the same as those of the first embodiment, and the description thereof is thus omitted.

In the first embodiment and the first through eleventh variations thereof, the air gap 30 may be formed as in the twelfth variation of the first embodiment, or the acoustic mirror 31 may be formed instead of the air gap 30 as in the thirteenth variation of the first embodiment.

As in the first embodiment and the first through twelfth variations thereof, the piezoelectric thin film resonator may be a Film Bulk Acoustic Resonator (FBAR) in which the air gap 30 is formed between the substrate 10 and the lower electrode 12 in the resonance region 50. Alternatively, as in the thirteenth variation of the first embodiment, the piezoelectric thin film resonator may be a Solidly Mounted Resonator (SMR) in which the acoustic mirror 31 reflecting the acoustic wave propagating through the piezoelectric film 14 is located below the lower electrode 12 in the resonance region 50. As described above, it is sufficient if the acoustic reflection layer located in or on the substrate 10 includes the air gap 30 or the acoustic mirror 31 in which at least two layers with different acoustic characteristics are stacked.

Second Embodiment

Figure 20:
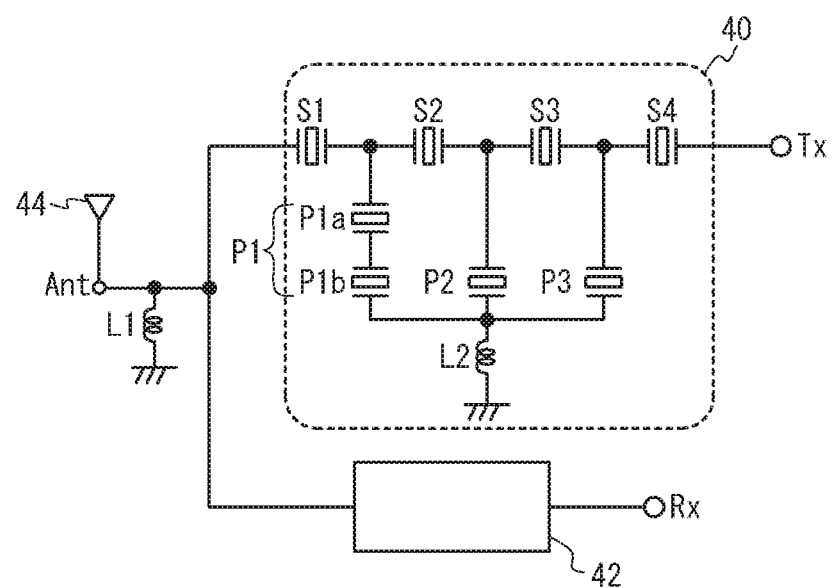
FIG. 20 is a circuit diagram of a duplexer in accordance with a second embodiment.

A second embodiment is an exemplary duplexer. FIG. 20 is a circuit diagram of a duplexer in accordance with the second embodiment. As illustrated in FIG. 20, a common terminal Ant is coupled to an antenna 44. A transmit filter 40 is connected between the common terminal Ant and a transmit terminal Tx. A receive filter 42 is connected between the common terminal Ant and a receive terminal Rx. An inductor L1 as a matching circuit is connected between the common terminal Ant and a ground. The transmit filter 40 transmits signals in the transmit band to the common terminal Ant as transmission signals among signals input from the transmit terminal Tx, and suppresses signals with other frequencies. The receive filter 42 transmits signals in the receive band to the receive terminal Rx as reception signals among signals input from the common terminal Ant, and suppresses signals with other frequencies. The inductor L1 matches impedance so that the transmission signal passing through the transmit filter 40 is output from the common terminal Ant without leaking to the receive filter 42.

The transmit filter 40 is a ladder-type filter. One or more series resonators S1 through S4 are connected in series between the common terminal Ant and the transmit terminal Tx. One or more parallel resonators P1 through P3 are connected in parallel between the common terminal Ant and the transmit terminal Tx. First ends of the parallel resonators P1 through P3 are commonly grounded through an inductor L2. The parallel resonator P1 is serially divided into resonators P1a and P1b.

Figure 21A:
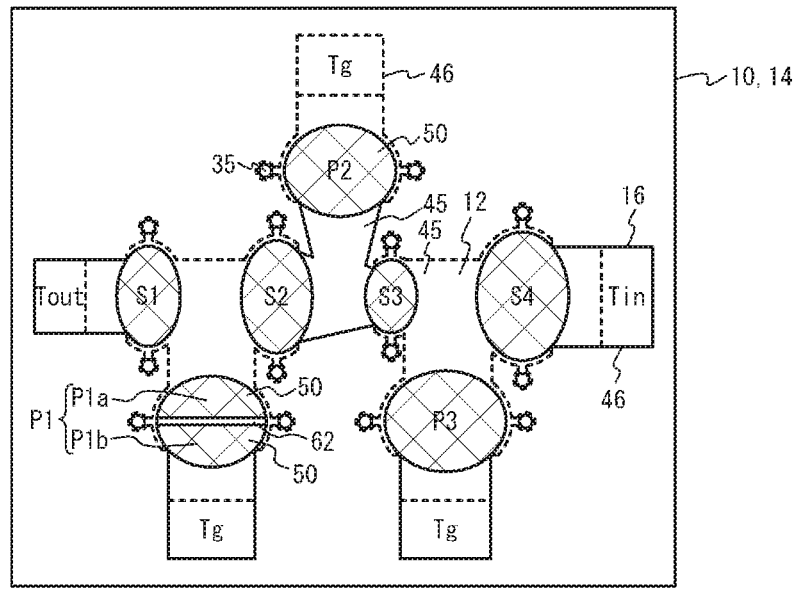
FIG. 21A is a plan view of a transmit filter in the second embodiment.
Figure 21B:
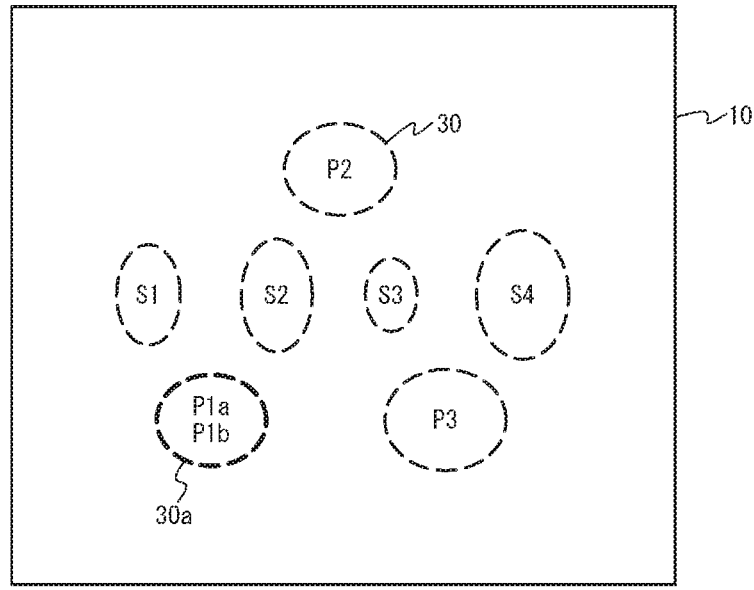
FIG. 21B is a plan view of air gaps.

FIG. 21A is a plan view of the transmit filter in the second embodiment, and FIG. 21B is a plan view of air gaps. As illustrated in FIG. 21A, the series resonators S1 through S4, the parallel resonators P1 through P3, wiring lines 45, and terminals 46 are formed on the substrate 10. Each of the series resonators S1 through S4 and the parallel resonators P1 through P3 has the own resonance region 50. The wiring line 45 interconnects the resonance regions 50, and connects the resonance region 50 and the terminal 46. The terminals 46 include an input terminal Tin, an output terminal Tout, and ground terminals Tg. The wiring line 45 and the terminal 46 are formed of the lower electrode 12 or the upper electrode 16.

As illustrated in FIG. 21A and FIG. 21B, in the resonators other than the parallel resonator P1, the single resonance region 50 is located in the single air gap 30. The resonators P1a and P1b are the piezoelectric thin film resonators according to any one of the first embodiment and the variations thereof, and two resonance regions 50 and the divided region 62 are located in a single air gap 30a. The air gap 30a in which the resonators P1a and P1b are located and other air gaps 30 have an elliptical shape. As described above, since the air gaps 30a and 30 have the same shape, the stress condition of the air gaps 30a and 30 for forming the multilayered film 18 can be made to be substantially the same. Thus, the air gaps 30a and 30 and the multilayered film 18 can be easily formed.

As described in the second embodiment, the transmit filter 40 includes a plurality of piezoelectric thin film resonators corresponding to a plurality of the resonance regions 50 located in the single air gap 30 of the first embodiment and the variations thereof. Thus, the parasitic capacitance C0 of the wiring line between the resonators P1a and P1b is reduced. Therefore, the secondary distortion is reduced. In addition, the mechanical fracture of the multilayered film is reduced.

The second embodiment has described an exemplary case where the first embodiment and the variations thereof are applied to the transmit filter 40, but the first embodiment and the variations thereof may be applied to the receive filter 42. In addition, an exemplary case where the first embodiment and the variations thereof are applied to a ladder-type filter has been described, but the first embodiment and the variations thereof may be applied to a lattice-type filter or a multimode filter. A duplexer has been described as an example of the multiplexer, but the multiplexer may be a triplexer or a quadplexer.

In addition, the parallel resonator P1 is divided into a plurality of resonators P1a and P1b (divided resonators), and the resonance regions 50 corresponding to the resonators P1a and P1b are located in the air gap 30a to share the air gap 30a. This structure reduces the secondary distortion. It is sufficient if the resonator to be divided is at least one of one or more series resonators and one or more parallel resonators. To reduce the secondary distortion, the series resonator S1 and/or the parallel resonator P1 located closest to the output terminal is preferably divided. The division may be parallel division illustrated in FIG. 2B. The number of the series resonators and the number of the parallel resonators can be freely selected.

Third Embodiment

Figure 22A:
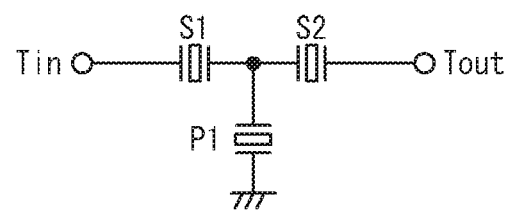
FIG. 22A is a circuit diagram of a filter in accordance with a third embodiment and a second comparative example.
Figure 22B:
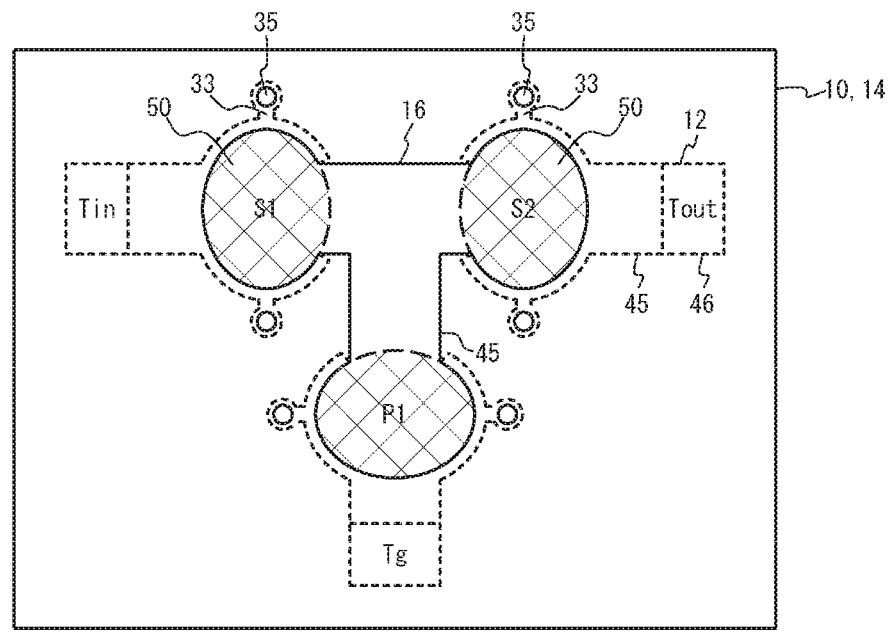
FIG. 22B is a plan view of the filter in accordance with the second comparative example.

A third embodiment applies the first embodiment and the variations thereof to a ladder-type filter. FIG. 22A is a circuit diagram of a filter in accordance with the third embodiment and a second comparative example, and FIG. 22B is a plan view of the filter in accordance with the second comparative example.

As illustrated in FIG. 22A, the series resonators S1 and S2 are connected in series and the parallel resonator P1 is connected in parallel between an input terminal Tin and an output terminal Tout. As illustrated in FIG. 22B, the resonance regions 50, the wiring lines 45, and the terminals 46 are located on the substrate 10. The wiring lines 45 and the terminals 46 are formed of the lower electrode 12 or the upper electrode 16. In the second comparative example, three resonance regions 50 corresponding to the resonators are formed on the substrate 10. Each of the three resonance regions 50 is located above the corresponding single air gap 30.

Figure 23:
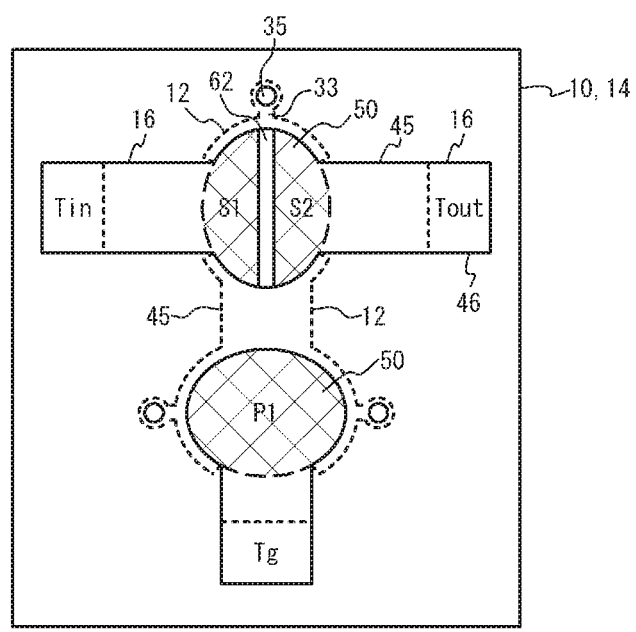
FIG. 23 is a plan view of the filter in accordance with the third embodiment.

FIG. 23 is a plan view of the filter in accordance with the third embodiment. As illustrated in FIG. 23, in the third embodiment, the resonance regions 50 corresponding to the series resonators S1 and S2 are located in the single air gap 30 to share the air gap 30. The upper electrodes 16 of the series resonators S1 and S2 are divided in the divided region 62. The upper electrodes 16 of the series resonators S1 and S2 are commonly coupled to the parallel resonator P1.

As in the third embodiment, a plurality of the series resonators S1 and S2 may be the resonators of the first embodiment and the variations thereof that share the single air gap 30.

Figure 24A:
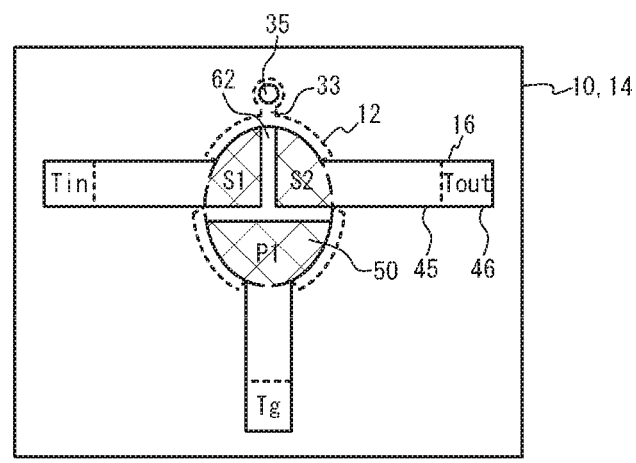
FIG. 24A is a plan view of a filter in accordance with a first variation of the third embodiment.
Figure 24B:
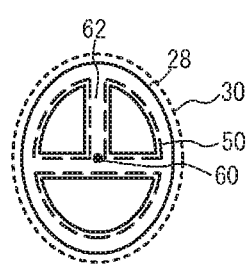
FIG. 24B is a plan view around the resonance region.

FIG. 24A is a plan view of a filter in accordance with a first variation of the third embodiment, and FIG. 24B is a plan view around the resonance region. As illustrated in FIG. 24A and FIG. 24B, three resonance regions 50 corresponding to the series resonators S1 and S2 and the parallel resonator P1 are located in the single air gap 30 to share the air gap 30. The upper electrode 16 is divided in the divided region 62. The lower electrode 12 is located in the divided region 62. Three resonators are electrically connected through the lower electrode 12. Other structures are the same as those of the third embodiment, and the description thereof is thus omitted.

Figure 25A:
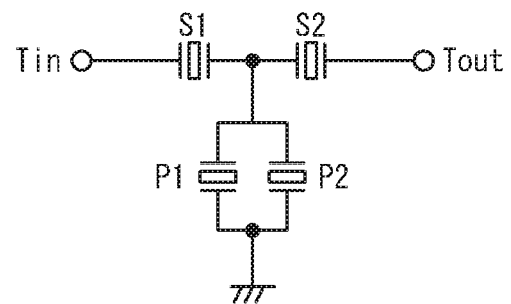
FIG. 25A is a circuit diagram of a filter in accordance with a second variation of the third embodiment.
Figure 25B:
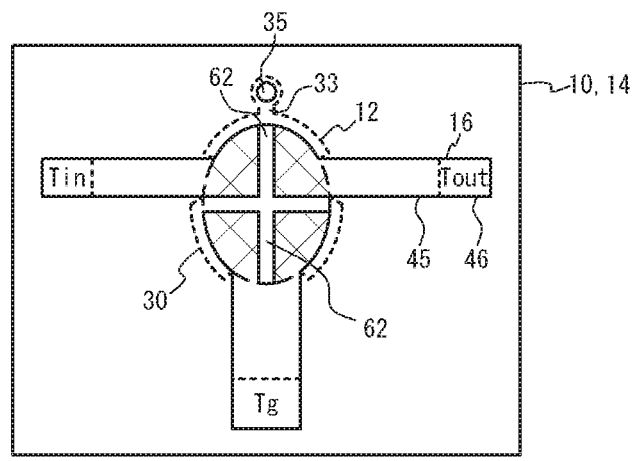
FIG. 25B is a plan view.
Figure 25C:
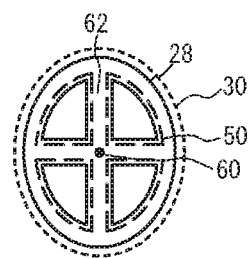
FIG. 25C is a plan view around the resonance region.

FIG. 25A is a circuit diagram of a filter in accordance with a second variation of the third embodiment, FIG. 25B is a plan view, and FIG. 25C is a plan view around the resonance region. As illustrated in FIG. 25A, two parallel resonators P1 and P2 are connected in parallel between a node between the series resonators S1 and S2 and a ground. As illustrated in FIG. 25B and FIG. 25C, four resonance regions 50 corresponding to the series resonators S1 and S2 and the parallel resonators P1 and P2 are located in the single air gap 30 to share the air gap 30. The upper electrode 16 is divided in the divided region 62. The lower electrode 12 is located in the divided region 62. Four resonators are electrically connected through the lower electrode 12. Other structures are the same as those of the third embodiment, and the description thereof is thus omitted.

As described in the first and second variations of the third embodiment, a plurality of the series resonators S1 and S2 and the parallel resonators P1 and P2 may be the resonator of the first embodiment and the variations thereof that share the single air gap 30.

As described in the variations of the third embodiment, the resonance regions 50 corresponding to at least one of a plurality of series resonators and at least one of a plurality of parallel resonators are located in the single air gap 30 to share the air gap 30. This structure reduces the parasitic capacitance of the wiring line between the series resonator and the parallel resonator. In addition, the mechanical fracture of the multilayered film is reduced.

Although the embodiments of the present invention have been described in detail, it is to be understood that the various change, substitutions, and alterations could be made hereto without departing from the spirit and scope of the invention.

What is claimed is:

1. An acoustic wave device comprising:
a substrate;
a piezoelectric film located on the substrate and one or more air gaps, each of the one or more air gaps being located in or on the substrate;
a lower electrode and an upper electrode located on the substrate and a single air gap among the one or more air gaps so as to sandwich the piezoelectric film so that a plurality of resonance regions are located within the single air gap and not located outside of the single air gap in a plan view so as to share the single air gap, one of the lower electrode and the upper electrode being divided, another one of the lower electrode and the upper electrode being not divided, each of the plurality of resonance regions being defined by a region where the lower electrode and the upper electrode face each other across at least a part of the piezoelectric film; and
an insertion film located between the lower electrode and the upper electrode and located in at least a part of an outer peripheral region of each of the plurality of resonance regions in a plan view, the insertion film being not located in a center region of each of the plurality of resonance regions,
wherein
the insertion film overlaps in a plan view with a divided region defined by a region where the one of the lower electrode and the upper electrode is divided and overlaps with the single air gap,
said not-divided another one of the lower electrode and the upper electrode is not directly connected to any piezoelectric resonator other than piezoelectric resonators formed of the plurality of resonance regions,
the one of the lower electrode and the upper electrode includes an extraction region defined by a region where the one of the lower electrode and the upper electrode is extracted from each of the plurality of resonance regions to outside of the single air gap,
an outer circumference of the one of the lower electrode and the upper electrode includes a part overlapping with the single air gap in the plan view,
the another one of the lower electrode and the upper electrode includes a wide portion defined by a portion where the another one of the lower electrode and the upper electrode is extracted from each of the plurality of resonance regions to outside of the single air gap other than an area overlapping with the extraction region, and
an outer circumference of the another one of the lower electrode and the upper electrode includes a part overlapping with the single air gap in the plan view.

2. The acoustic wave device according to claim 1, further comprising a filter including a plurality of piezoelectric thin film resonators corresponding to the plurality of resonance regions.

3. The acoustic wave device according to claim 2, further comprising:
one or more series resonators connected in series between an input terminal and an output terminal; and
one or more parallel resonators connected in parallel between the input terminal and the output terminal, wherein
at least one of the one or more series resonators and the one or more parallel resonators is divided into a plurality of divided resonators, and
the plurality of resonance regions correspond to the plurality of divided resonators.

4. The acoustic wave device according to claim 2, further comprising:
one or more series resonators connected in series between an input terminal and an output terminal; and
one or more parallel resonators connected in parallel between the input terminal and the output terminal, wherein
the plurality of resonance regions include at least one of the one or more series resonators and at least one of the one or more parallel resonators.

5. The acoustic wave device according to claim 1, wherein the insertion film is located in a closed-loop fashion surrounding the center region of each of the plurality of resonance regions.

6. The acoustic wave device according to claim 5, wherein the insertion film is a single insertion film located so as to correspond to the plurality of resonance regions.

7. The acoustic wave device according to claim 1, wherein the upper electrode is divided in a divided region in which the one of the lower electrode and the upper electrode is divided.

8. The acoustic wave device according to claim 7, wherein the piezoelectric film includes a lower piezoelectric film and an upper piezoelectric film located on the lower piezoelectric film,
the insertion film is located between the lower piezoelectric film and the upper piezoelectric film, and
the upper electrode and the upper piezoelectric film are divided in the divided region.

9. The acoustic wave device according to claim 1, wherein the insertion film overlaps with a center of the single air gap in a plan view.

10. The acoustic wave device according to claim 1, wherein
the lower electrode is divided in a divided region in which the one of the lower electrode and the upper electrode is divided.

11. The acoustic wave device according to claim 1, wherein
a width of the insertion film in the plurality of resonance regions is substantially constant.

12. The acoustic wave device according to claim 1, wherein
two resonance regions are located within the single air gap and not located outside of the single air gap, and
any resonance regions other than the two resonance regions are not located within the single air gap.

13. An acoustic wave device comprising:
a substrate;
a piezoelectric film located on the substrate and one or more air gaps, each of the one or more air gaps being located in or on the substrate; and
a lower electrode and an upper electrode located on the substrate and a single air gap among the air gaps so as to sandwich the piezoelectric film so that a region in which at least one of the lower electrode and the upper electrode is located in a plan view substantially entirely overlaps with the single air gap in a plan view and a plurality of resonance regions are located within the single air gap and not located outside of the single air gap in a plan view so as to share the single air gap, one of the lower electrode and the upper electrode being divided, another one of the lower electrode and the upper electrode being not divided, each of the plurality of resonance regions being defined by a region where the lower electrode and the upper electrode face each other across at least a part of the piezoelectric film, wherein the one of the lower electrode and the upper electrode includes an extraction region defined by a region where the one of the lower electrode and the upper electrode is extracted from each of the plurality of resonance regions to outside of the single air gap, an outer circumference of the one of the lower electrode and the upper electrode includes a part overlapping in the plan view with the single air gap in the plan view, the another one of the lower electrode and the upper electrode includes a wide portion defined by a portion where the another one of the lower electrode and the upper electrode is extracted from each of the plurality of resonance regions to outside of the single air gap other than an area overlapping with the extraction region, and an outer circumference of the another one of the lower electrode and the upper electrode includes a part overlapping with the single air gap in the plan view.

14. The acoustic wave device according to claim 13, further comprising a filter including a plurality of piezoelectric thin film resonators corresponding to the plurality of resonance regions.

15. The acoustic wave device according to claim 14, further comprising:
one or more series resonators connected in series between an input terminal and an output terminal; and
one or more parallel resonators connected in parallel between the input terminal and the output terminal, wherein
at least one of the one or more series resonators and the one or more parallel resonators is divided into a plurality of divided resonators, and
the plurality of resonance regions correspond to the plurality of divided resonators.

16. The acoustic wave device according to claim 14, further comprising:
one or more series resonators connected in series between an input terminal and an output terminal; and
one or more parallel resonators connected in parallel between the input terminal and the output terminal, wherein
the plurality of resonance regions include at least one of the one or more series resonators and at least one of the one or more parallel resonators.

* * * * *